United States Patent
Jinbo et al.

(10) Patent No.: US 6,208,281 B1
(45) Date of Patent: Mar. 27, 2001

(54) RESISTANCE LADDER TOGETHER WITH DIGITAL-ANALOG CONVERTER AND SEMICONDUCTOR USING THE SAME

(75) Inventors: Keiji Jinbo; Akihiro Fukuzawa, both of Hino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/242,924

(22) PCT Filed: Jul. 2, 1998

(86) PCT No.: PCT/JP98/02978

§ 371 Date: May 21, 1999

§ 102(e) Date: May 21, 1999

(87) PCT Pub. No.: WO99/01939

PCT Pub. Date: Jan. 14, 1999

(30) Foreign Application Priority Data

Jul. 3, 1997 (JP) .................................................. 9-178620

(51) Int. Cl.[7] ...................................................... H03M 1/78
(52) U.S. Cl. ............................................. 341/154; 341/144
(58) Field of Search ...................................... 341/144, 155

(56) References Cited

U.S. PATENT DOCUMENTS

| 4,398,207 | | 8/1983 | Hoff, Jr. et al. ........................ 357/51 |
| 4,703,302 | * | 10/1987 | Hino et al. ............................ 338/293 |
| 4,803,461 | * | 2/1989 | Yamaguchi et al. .................. 341/154 |
| 5,489,547 | * | 2/1996 | Erdeljac et al. ....................... 437/60 |
| 6,046,491 | * | 4/2000 | Tamagawa ............................ 257/538 |

FOREIGN PATENT DOCUMENTS

| 55-163914 | 12/1980 | (JP) | ............................... H03K/13/00 |
| 58-171843 | 10/1983 | (JP) | ............................... H01L/27/04 |
| 60-79766 | 5/1985 | (JP) . | |
| 2-28269 | 6/1990 | (JP) . | |
| 4-69950 | 3/1992 | (JP) . | |
| 5-206863 | 8/1993 | (JP) . | |
| 9-223775 | 8/1997 | (JP) | ............................... H01L/27/04 |

* cited by examiner

Primary Examiner—Peguy JeanPierre
(74) Attorney, Agent, or Firm—Oliff & Berridge

(57) ABSTRACT

A resistance ladder (10) is formed by connecting together a plurality of resistance groups (12, 14, and 15), each having at least first to third resistors extending in a longitudinal axial direction (20, 30, and 40). In each resistance group (12, 14, and 15), the second and third resistors (30 and 40) are disposed parallel to a longitudinal axial direction X on either side of the first resistor (20). Driver circuits (16, 17 and 18) are connected to the third resistors (40) of the corresponding resistance groups, and are disposed at one end of the longitudinal axial direction X thereof. The first to third resistors (20, 30 and 40) are connected together by a first wiring layer (60) formed on top of an insulation layer (50). Neighboring resistance groups (12, 14, and 15) are connected together by a second wiring layer (70) formed of the same layer as the first wiring layer (60). The second wiring layer (70) connects one end (61) of the first resistor (20) of the Nth resistance group (14) to the other end (62) of the first resistor (20) of the (N+1)th resistance group (15), and is also formed to extend on top of the other resistors (30 and 40) at a position between these two first resistors (20). In each of the resistance groups (12, 14, and 15), the surface areas of the second wiring layer (70) corresponding to each of the first to third resistors (20, 30, and 40) are set to be substantially equal.

23 Claims, 19 Drawing Sheets

RESISTANCE LADDER TOGETHER WITH DIGITAL-ANALOG CONVERTER AND SEMICONDUCTOR USING THE SAME

TECHNICAL FIELD

This invention relates to a resistance ladder, exemplified by a R-2R resistance ladder in which two resistors of resistances R and 2R are connected together in a ladder structure. This invention also relates to a digital-to-analog converter and a semiconductor device using such a resistance ladder. In particular, this invention relates to an improvement that reduces variations in the resistances of a plurality of resistors comprised within the resistance ladder, thus increasing the digital-to-analog conversion accuracy thereof even further.

BACKGROUND OF ART

A plan view of a prior-art R-2R resistance ladder 500 as disclosed in Japanese Patent Publication No. 2-28269 is shown in FIG. 19, and an equivalent circuit diagram of the resistance ladder 500 of FIG. 19 is shown in FIG. 20.

This resistance ladder 500 comprises adjacent resistance groups 501 and 502. Each of the resistance groups 501 and 502 is provided with first to third resistors 511, 512, and 513. As shown in FIG. 20, the first resistor 511 is a resistor that forms one resistance (R) of the R-2R resistance ladder 500 and the second and third resistors 512 and 513 are resistors that form a combined resistance (2R). In FIG. 19, the first and third resistors 511 and 513 are disposed on either side of the second resistor 512.

An insulation layer (not shown in the figure) is formed above these first to third resistors 511 to 513. A wiring layer 515, indicated by hatching in FIG. 19, is formed above the insulation layer. The wiring layer 515 is connected to the first to third resistors 511 to 513 via contact holes 520. Note that a driver circuit is connected to the third resistor 513.

However, with this structure, the surface areas of the wiring layer 515 corresponding to each of the first to third resistors 511 to 513 are different. In particular, the surface area of the wiring layer 515 corresponding to the third resistor 513 is extremely small. Thus the presence of the wiring layer 515 corresponding to regions above the first to third resistors 511 to 513 causes the resistances of the first to third resistors 511 to 513 to vary due to piezoelectric effects, and moreover the amounts of these variations are different in each of the first to third resistors 511 to 513.

If a digital-to-analog converter (hereinafter called a D/A converter) is configured by using this resistance ladder, therefore, the conversion accuracy thereof will be inferior.

In another resistance ladder of the prior art, the driver circuits connected to the third resistors 513 of adjacent resistance groups 501 and 502 are not disposed at one side in the direction indicated by X in FIG. 19, but are disposed separately at one end and the other end thereof in the X direction. In this case, it is not possible to gather together the driver circuits at one side portion of the resistance ladder, so that an increased region of the layout of the semiconductor device is wasted, which leads to an increase in the chip surface area.

An objective of this invention is to provide a resistance ladder in which the amounts of variation in resistance caused by the correspondence between the resistors and the wiring layer are substantially the same for all resistors, and which enables a reduction in the surface area of the layout, together with a digital-to-analog converter and a semiconductor device that use this resistance ladder.

Another objective of this invention is to provide a resistance ladder which makes it possible to dispose a plurality of driver circuits at one side of a resistor formation region, together with a digital-to-analog converter and a semiconductor device that use this resistance ladder.

DISCLOSURE OF THE INVENTION

One aspect of this invention relates to a resistance ladder formed by connecting together a plurality of resistance groups, where each of the resistance groups has at least first to third resistors extending along a longitudinal axial direction, the resistance ladder comprising:

an insulation layer formed on top of each of the first to third resistors of each of the resistance groups and having contact holes at positions corresponding to end portions in the longitudinal axial direction of each of the first to third resistors;

a first wiring layer formed on top of the insulation layer, connecting together the first and second resistors and the second and third resistors within each of the resistance groups via the contact holes; and a second wiring layer formed as the same layer as the first wiring layer and connecting together adjacent resistance groups;

wherein the second and third resistors in each of the resistance groups are disposed parallel to the longitudinal axial direction and on either side of the first resistor;

wherein the second wiring layer connects together one end in longitudinal axial direction of the first resistor of one of the adjacent resistance groups to the other end in the longitudinal axial direction of the first resistor of another of the adjacent resistance group, and is also formed to extend over other resistors positioned between the first resistors of the adjacent resistance groups; and wherein surface areas of the second wiring layer corresponding to each of the first to third resistors in each of the resistance groups are set to be substantially equal.

With this aspect of the invention, the amounts of variation in the resistances of the first to third resistors are substantially equal. It is therefore possible to construct a D/A converter for converting an n-bit digital signal into an analog signal, by providing n resistance groups in this resistance ladder and connecting n driver circuits that are each connected to one of the resistance groups. Since the resistance ratios within the resistance ladder incorporated into this D/A converter are substantially constant, the conversion accuracy thereof can be improved. It is also possible to construct an A/D converter incorporating this D/A converter, in which case the conversion efficiency is similarly improved.

In addition, this invention makes it possible to dispose the driver circuits, which are connected to the resistance groups, at one side in the longitudinal axial direction, thus making it possible to avoid wastage of space. It is therefore possible to increase the degree of integration of a semiconductor device in which this resistance ladder is incorporated.

In such a case, if the second wiring layer is formed extending linearly at a constant angle of inclination with respect to the longitudinal axial direction, the surface areas of the second wiring layer corresponding to each of the first to third resistors can be set to be substantially equal.

Alternatively, the second wiring layer could be configured of a plurality of parallel wiring portions that are parallel to the longitudinal axial direction and a plurality of orthogonal wiring portions that are perpendicular to the longitudinal axial direction, connecting the parallel wiring portions. If the total length of the second wiring layer in the longitudinal axial direction is L in this case, the length of each parallel wiring portion corresponding to the first to third resistors can be set to be substantially L/3. This makes it possible to set the surface areas of the second wiring layer corresponding to each of the first to third resistors to be substantially equal.

In addition, the sum of the length of each parallel wiring portion connected to one end in the longitudinal axial direction of the first resistor in each resistance group plus the length of the parallel wiring portion connected to the other end in the longitudinal axial direction of the first resistor can be set to be substantially L/3.

Furthermore, a resistance group positioned at a far end portion could have a dummy wiring layer formed as the same layer as the second wiring layer. This makes it possible to ensure that the amount of variation in the resistances of the first to third resistors is substantially equal, even in the resistance group positioned at the far end portion.

Another aspect of this invention relates to a resistance ladder formed by connecting together a plurality of resistance groups, where each of the resistance groups has at least first to third resistors extending along a longitudinal axial direction, the resistance ladder comprising:

a first insulation layer formed on top of each of the first to third resistors and having first contact holes at positions corresponding to end portion in the longitudinal axial direction of each of the first to third resistors;

a first wiring layer formed on top of the first insulation layer, connecting together the first to third resistors via the contact holes;

a dummy wiring layer formed as the same layer as the first wiring layer and corresponding to the first to third resistors;

a second insulation layer formed on top of the first wiring layer and the dummy wiring layer and having second contact holes at positions corresponding to the first wiring layer; and a second wiring layer formed on top of the second insulation layer and connecting together adjacent resistance groups via the second contact holes.

This aspect of the invention determines the amount of variation in the resistances of the first to third resistors in a positive manner, by controlling the surface areas of the first to third resistors corresponding to the dummy wiring layer. Therefore, if all of these surface areas are substantially equal, the amount of variation in the resistances is also equal. In this case, if the surface areas of the second wiring layer corresponding to each of the first to third resistors is not the same, the effect on the variations in the resistances can be further reduced.

Therefore, if this resistance ladder is used in a D/A converter or A/D converter, the conversion accuracy thereof can be increased.

A further aspect of this invention relates to a digital-to-analog converter for converting an n-bit digital signal into an analog signal, the digital-to-analog converter comprising:

a resistance ladder formed by connecting together n resistance groups, where each of the resistance groups has at least first to third resistors extending along a longitudinal axial direction; and n driver circuits connected each to one of the resistance groups;

wherein the resistance ladder comprises:

a first insulation layer formed on top of each of the first to third resistors of each of the resistance groups and having contact holes corresponding to end portions in the longitudinal axial direction of each of the first to third resistors;

a first wiring layer formed on top of the first insulation layer, connecting together the first and second resistors and the second and third resistors within each of the resistance groups via the contact holes; and a second wiring layer formed as the same layer as the first wiring layer and connecting together adjacent resistance groups;

wherein the second and third resistors in each of the resistance groups are disposed parallel to the longitudinal axial direction and on either side of the first resistor;

wherein the second wiring layer connects together one end in the longitudinal axial direction of the first resistor of one of adjacent resistance groups to the other end in the longitudinal axial direction of the first resistor of another of the adjacent resistance groups, and is also formed to extend over other resistors positioned between the first resistors of the adjacent resistance groups; and wherein the n driver circuits are connected each to one of the third resistors of the resistance groups and are also disposed at one side in the longitudinal axial direction.

With this aspect of the invention, the driver circuits connected to the resistance groups can be disposed at one side in the longitudinal axial direction, making it possible to avoid wasted space. It is therefore possible to increase the degree of integration of a semiconductor device in which this resistance ladder is incorporated.

BEST MODE FOR CARRYING OUT THE INVENTION

First Embodiment

Figure 1:
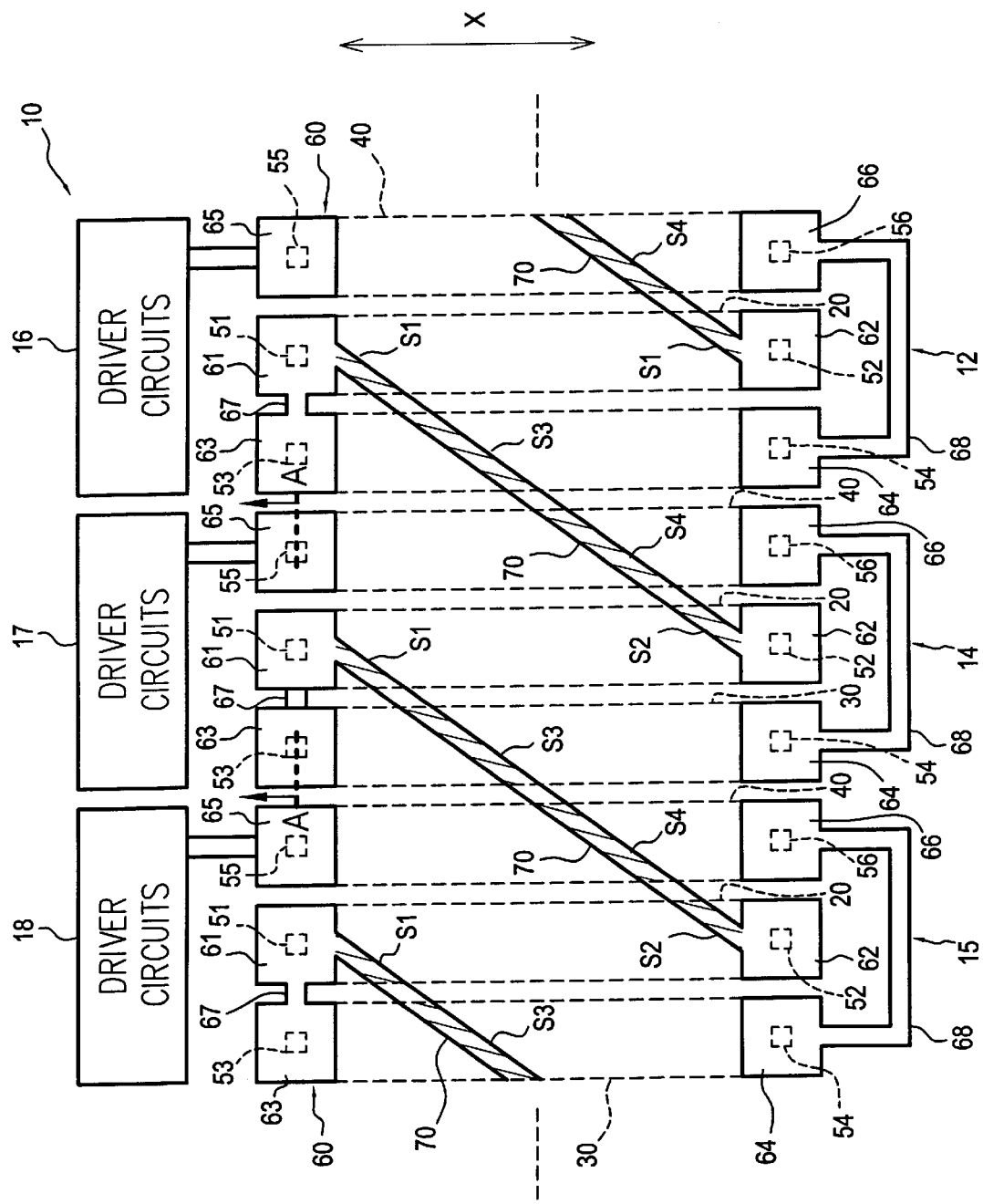
FIG. 1 is a schematic plan view of a resistance ladder in accordance with a first embodiment of this invention.
Figure 2:
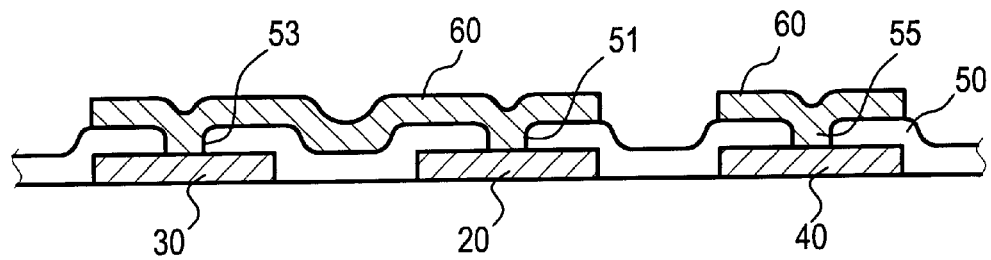
FIG. 2 is a cross-sectional view taken along the line A—A of FIG. 1.

A plan view of a resistance ladder 10 in accordance with a first embodiment of this invention is shown in FIG. 1 with a cross-sectional view taken along the line A—A of FIG. 1 shown in FIG. 2.

In FIG. 1, this resistance ladder 10 comprises (N−1)th, Nth, and (N+1)th resistance groups 12, 14, and 15, and driver circuits 16, 17, and 18 are connected to the resistance groups 12, 14, and 15, respectively. Each of the resistance groups 12, 14, and 15 comprises first to third resistors 20, 30, and 40 with the longitudinal axial direction of each resistor being aligned in a direction indicated by the arrows X. The second and third resistors 20 and 30 are disposed parallel in the longitudinal axial direction X on either side of the corresponding first resistor 20. The first to third resistors 20, 30, and 40 all have the same length and also the same width, and are disposed at equal spacing. Note that these first to third resistors 20, 30, and 40 could be formed of polysilicon on top of an insulator, and could be formed by patterning after ion doping.

Figure 3:
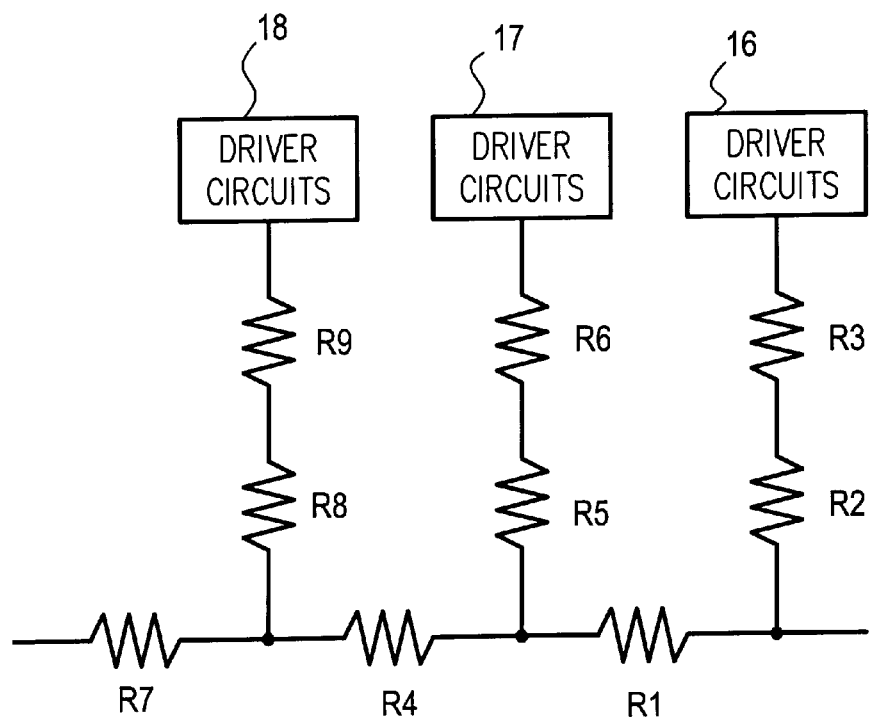
FIG. 3 is an equivalent circuit of the resistance ladder of FIG. 1.

As shown in FIG. 2, an insulation layer 50 is formed on top of the first to third resistors 20, 30, and 40. Contact holes 51 and 52 are formed in this insulation layer 50 at positions corresponding to the two end portions in the longitudinal axial direction X of the first resistor 20, as shown in FIG. 3. Similarly, contact holes 53 to 56 are also formed in the insulation layer 50 at positions corresponding to the second and third resistors 30 and 40.

A first wiring layer 60 is formed by using aluminum, for example, on top of the insulation layer 50, as shown in FIG. 2. This first wiring layer 60 is designed to connect together the first and second resistors 20 and 30 and also the second and third resistors 30 and 40 within each of the resistance groups 12, 14 and 15, as shown in FIG. 1. The first wiring layer 60 has contact wiring portions 61 to 66 embedded in the contact holes 51 to 56 formed at positions corresponding to the two end portions in the longitudinal axial direction X of each of the first to third resistors 20, 30, and 40. The first wiring layer 60 is also provided with a first resistor-connecting wiring portion 67 connecting together the contact wiring portions 61 and 63, and thus connecting together adjacent first and second resistors 20 and 30. The first wiring layer 60 is further provided with a second resistor-connecting wiring portion 68 connecting together the contact wiring portions 64 and 66, and thus connecting the second and third resistors 20 and 30. This second resistor-connecting wiring portion 68 is formed around the outside of the resistor structure of the first to third resistors 20 to 40. Thus the first and second resistor-connecting wiring portions 67 and 68 do not pass over the first to third resistors 20 to 40.

A second wiring layer 70 is provided to connect together the resistance groups 12, 14 and 15, as shown in FIG. 1. This second wiring layer 70 is formed as the same layer as the first wiring layer 60 and of the same material, such as aluminum. This second wiring layer 70 connects together adjacent resistance groups, so that the contact wiring portion 61 of the first resistor 20 within the Nth resistance group 14 is connected thereby to the contact wiring portion 62 of the first resistor 20 within the (N+1)th resistance group 15, by way of example. In FIG. 1, the second wiring layer 70 is shown formed to extend in a straight line at a constant angle of inclination (such as 45°) with respect to the longitudinal axial direction X. Thus the second wiring layer 70 passes over the first and second resistors 20 and 20 within the Nth resistance group 14 and the first and third resistors 20 and 40 within the (N+1)th resistance group 15.

The above described first to third resistors 20 to 40, insulation layer 50, and first and second wiring layers 60 and 70 are all formed by using semiconductor fabrication processes for forming logic circuits on a semiconductor substrate, and this completes the semiconductor device.

If the first resistor 20 of the Nth resistance group 14 of this configuration is considered, the contact wiring portion 62 is connected to the second wiring layer 70 for connection to the (N+1)th resistance group 15 and the contact wiring portion 62 is connected to the second wiring layer 70 for connection to the (N−1)th resistance group 12.

As shown in FIG. 1, assume that the surface area (the hatched area) of the second wiring layer 70 that is connected to the contact wiring portion 61 and corresponds to the first resistor 20 is S1 and the surface area (the hatched area) of the second wiring layer 70 that is connected to the contact wiring portion 62 and corresponds to the first resistor 20 is S2. Similarly, the surface areas (hatched areas) of the second wiring layer 70 corresponding to the second and third resistors are S3 and S4 in FIG. 1, respectively.

With the configuration of this embodiment, S1°S2=S3=S4. In other words, the surface areas of the second wiring layer 70 that correspond to each of the first to third resistors 20, 30, and 40 are substantially equal. This makes it possible to reduce the amounts of variation in the resistances of the first to third resistors 20 to 40 that are caused by piezoelectric effects. As a result, the resistance ratios of the first to third resistors 20 to 40 can be made substantially constant.

An equivalent circuit of the resistance ladder of FIG. 1 is shown in FIG. 3. In this case, assume that the resistances of the first to third resistors 20, 30, and 40 within the (N−1)th resistance group 12 of FIG. 1 are R1, R2, and R3, respectively. Furthermore, assume that the resistance of the first to third resistors 20, 30, and 40 within the Nth resistance group 14 are R4, R5, and R6, respectively. Similarly, assume that the resistances of the first to third resistors 20, 30, and 40 within the (N+1)th resistance group 15 are R7, R8, and R9, respectively. The equivalent circuit of FIG. 3 illustrates the connective state of the resistances R1 to R9 defined above.

In this case, the resistances of all the resistors of this embodiment are set to be equal, so R1=R2=R3=R4=R5=R6=R7=R8=R9=R. It is therefore clear from FIG. 3 that R-2R resistance ladders are constructed by connecting together resistances R (=R1=R4=R7) and resistances 2R (=R2+R3=R5+R6=R8+R9) in a ladder structure.

In addition, this embodiment makes it possible to dispose the driver circuits 16, 17, and 18 at one side in the longitudinal axial direction X, as shown in FIGS. 1 and 3. This enables a reduction in the surface area occupied on the chip, without wasting any surface area of the layout of a semiconductor device that incorporates this resistance ladder.

Figure 17:
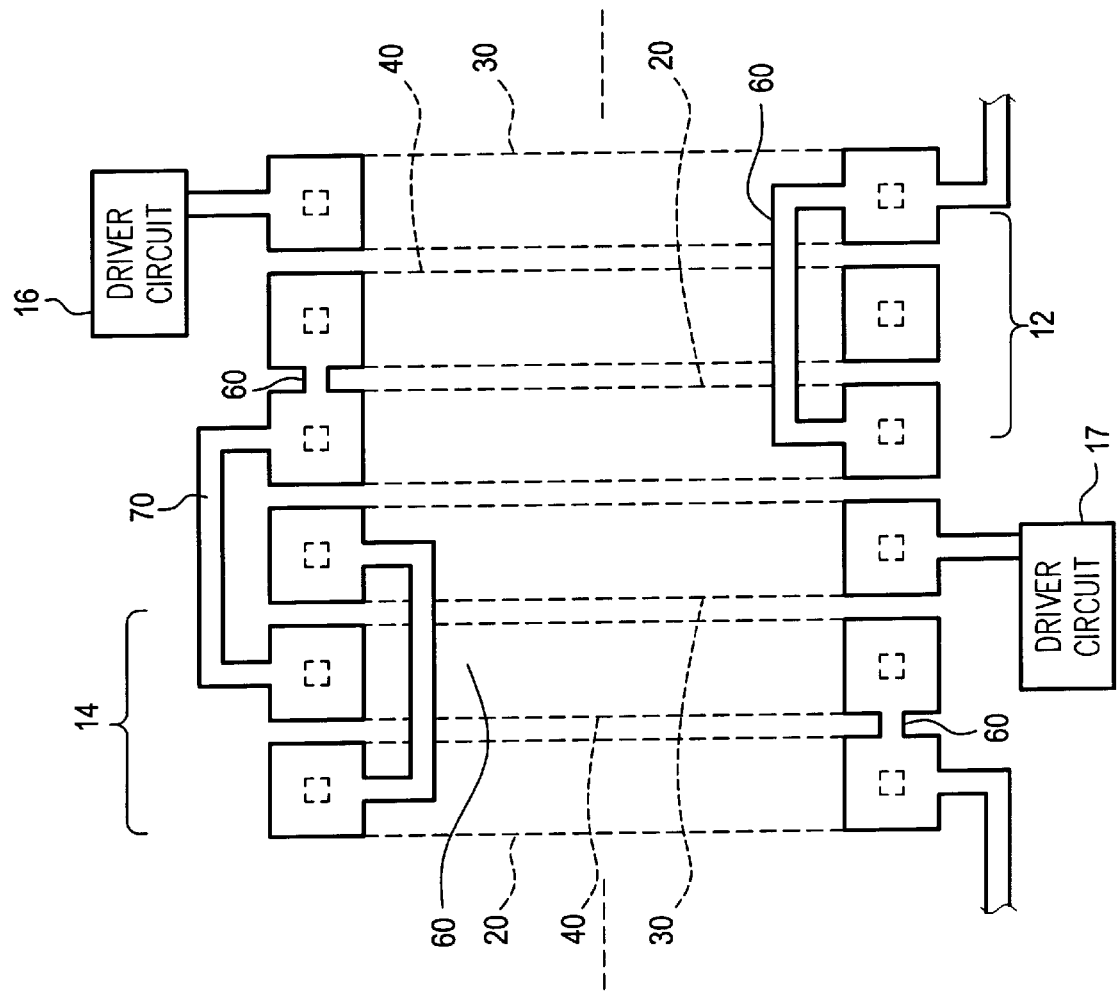
FIG. 17 is a schematic plan view of a resistance ladder that is a comparative example with respect to this invention.
Figure 18:
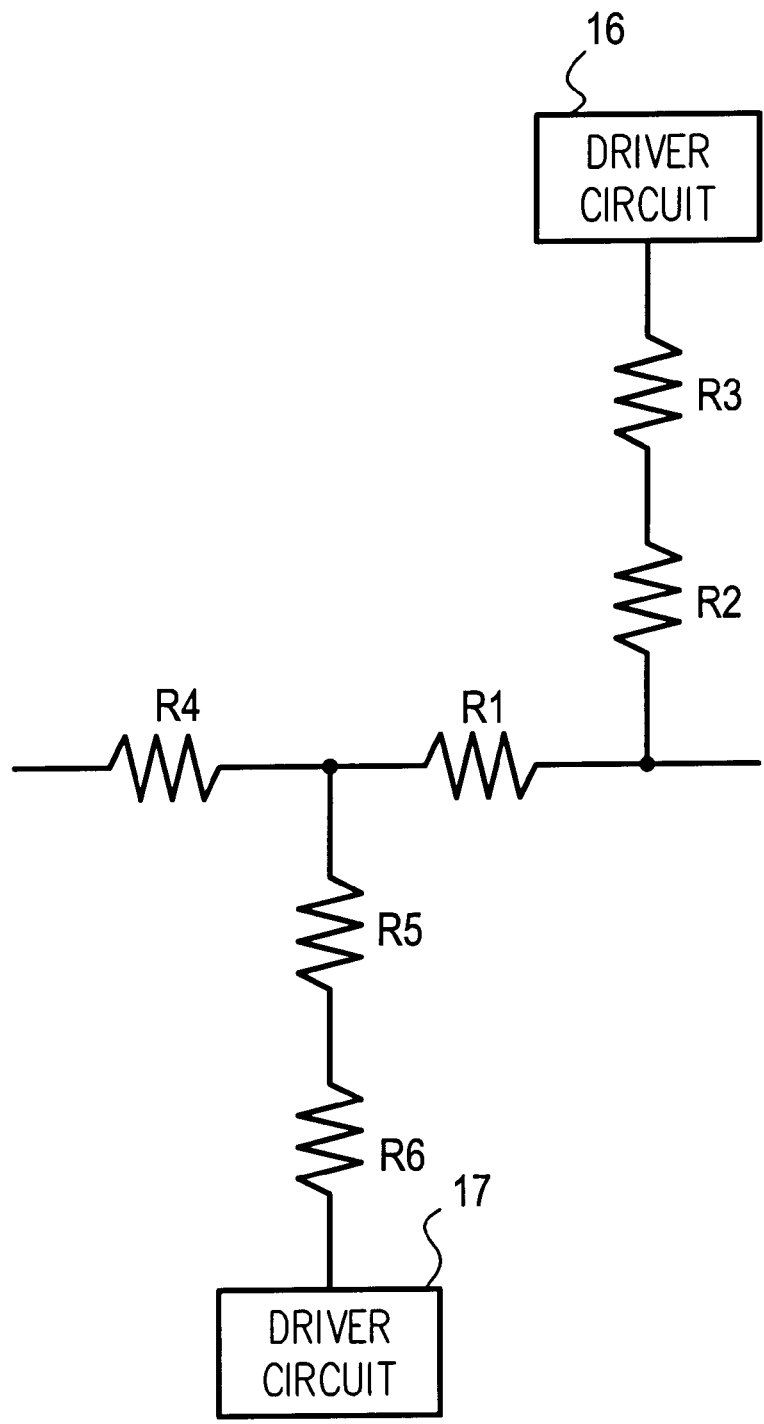
FIG. 18 is an equivalent circuit of the resistance ladder of FIG. 17.

A comparative example for the first embodiment is shown in FIG. 17 and an equivalent circuit thereof is shown in FIG. 18. The method used to arrange the first to third resistors 20 to 40 in the resistance ladder shown in FIG. 17 is the same at that of the first embodiment, but there are modifications in the connections of the first and second wiring layers 60 and 70. In this case, even though the surface areas of the first wiring layer 60 corresponding to each of the first to third resistors 20 to 40 are substantially equal, the driver circuits 16 and 17 are positioned at different end portions in the longitudinal axial direction X, as shown in FIGS. 17 and 18. Therefore, the configuration of this comparative example is inferior to that of the present invention in that some of the surface area of the layout is wasted.

In the comparative example of FIG. 17, the first wiring layer 60 is not present above regions covering the major part of the first to third resistors 20 to 40, so the aluminum pattern is in a minimalistic state. This resistance ladder is formed by the same processing as that of the logic circuit described above. In this case, the aluminum pattern is minimal in the resistance ladder region, as opposed to the dense aluminum pattern in the logic circuit region. If there is any bias in the density of the aluminum pattern on the same substrate, this will interfere with the accuracy of etching, and thus wiring defects will occur.

From this point of view, the first embodiment of this invention makes it possible to ensure an aluminum pattern of a better density above the first to third resistors 20 to 40 than the comparative example of FIG. 17, making it possible to reduce defects in the aluminum wiring.

Figure 4:
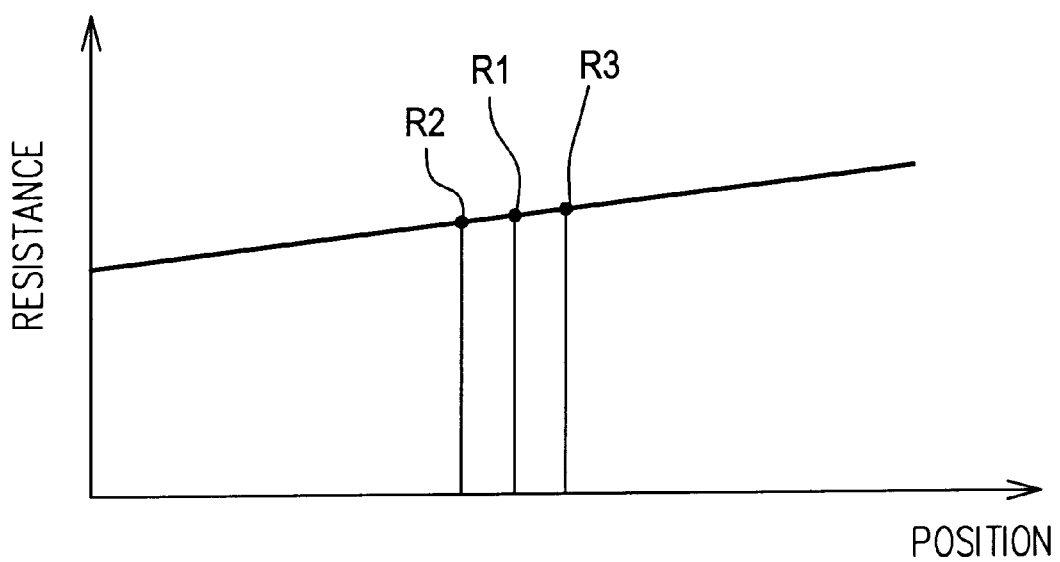
FIG. 4 is a graph of the relationship between position and resistance of the resistors of FIG. 1.

With this embodiment of the invention, the pitch at which the first to third resistors 20 to 40 are arrayed is made constant. In other words, the second and third resistors 30 and 40 are disposed with linear symmetry about the centerline of the first resistors 20. This has the effect of controlling errors in the resistances of the first to third resistors 20 to 40. The resistance of each resistor is dependent on position. Since the thickness or conductivity of a resistor varies with position, the resistance of a resistor generally increases or decreases monotonically with distance, as shown in FIG. 4. However, the above described linear symmetry ensures that relationships between the resistance of the first resistor 20 to the third resistor 40 are such that R1≈(R2+R3)/2, so that errors in the resistances can be reduced.

Second Embodiment

Figure 5:
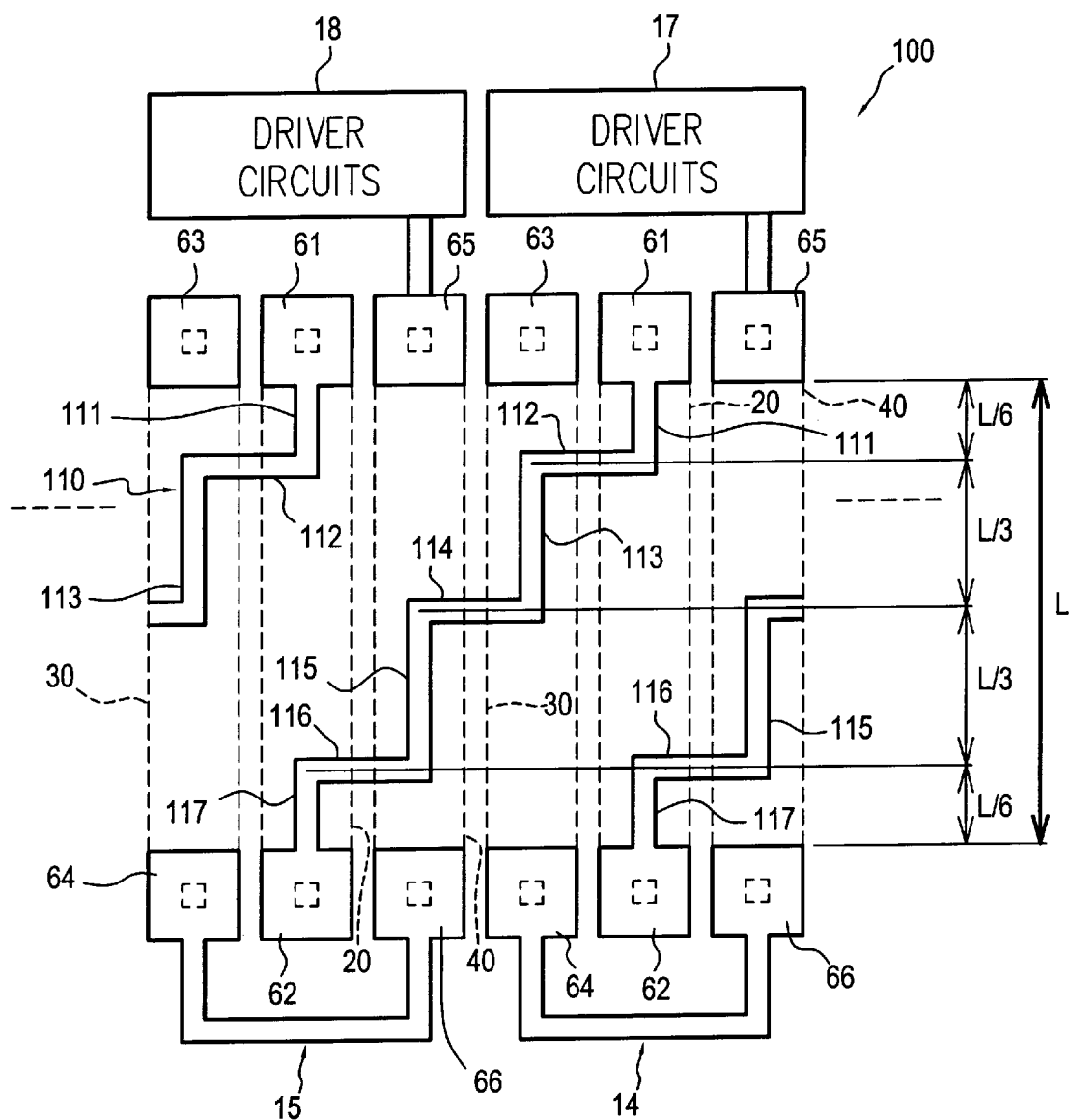
FIG. 5 is a schematic plan view of a resistance ladder in accordance with a second embodiment of this invention.

A resistance ladder 100 in accordance with a second embodiment of this invention is shown in FIG. 5. Note that components in FIG. 5 that have the same function as components in FIG. 1 are denoted by the same reference numbers as those in FIG. 1 and further description thereof is omitted.

The resistance ladder 100 of FIG. 5 differs from the resistance ladder 10 of FIG. 1 in that a second wiring layer 110 of the form shown in FIG. 5 is used instead of the second wiring layer 70 of FIG. 1.

The second wiring layer 110 shown in FIG. 5 has first to fourth parallel wiring portions 111, 113, 115, and 117 which are parallel to the longitudinal axial direction X and first to third orthogonal wiring portions 112, 114, and 116 which are perpendicular to the longitudinal axial direction X and connect together the first to fourth parallel wiring portions.

The first parallel wiring portion 111 is connected to the contact wiring portion 61 of the Nth resistance group 14 and the fourth parallel wiring portion 117 is connected to the contact wiring portion 62 of the (N+1)th resistance group 16.

In this case, assume that the total length in the longitudinal axial direction X of the second wiring layer 110 of FIG. 5 is L. The substantive length of each of the first and fourth parallel wiring portions 111 and 117 in the longitudinal axial direction X is L/6 and the substantive length of the second and third parallel wiring portions 113 and 115 in the longitudinal axial direction X is L/3. In this document, "substantive length" means the effective length, excluding the width of the wiring portion.

Assume in this case that the surface area of the first parallel wiring portion 111 and the first orthogonal wiring portion 112 corresponding to the first resistor 20 is S1 and the surface area of the fourth parallel wiring portion 117 and the third orthogonal wiring portion 116 corresponding to the first resistor 20 is S2.

Figure 6:
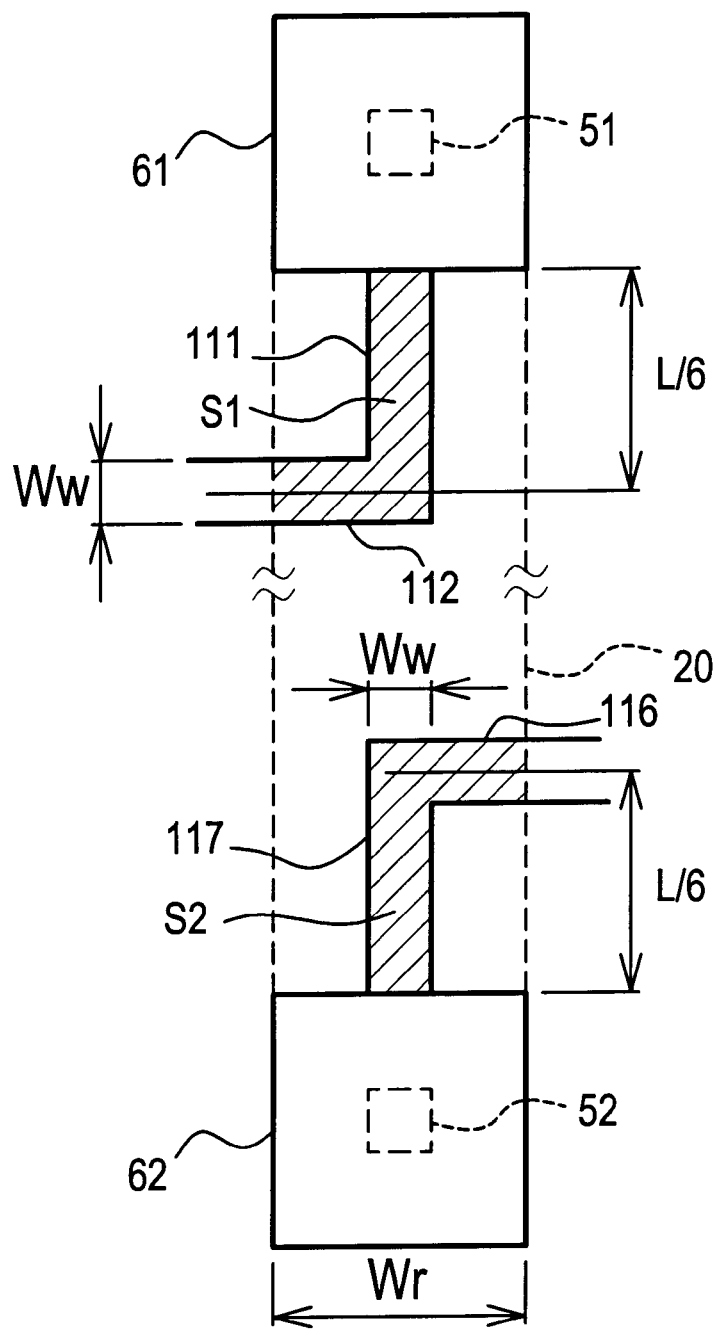
FIG. 6 is a partial illustrative view, showing the surface areas of the second wiring layer of FIG. 5 that correspond to the first resistor.

These surface areas S1 and S2 are indicated by hatching in FIG. 6. In this case, if the width of the first resistor 20 is Wr and the width of the second wiring layer 110 is Ww, the surface areas S1 and S2 are as follows:

$$S1=S2=Ww\ (L/6+Wr/2) \quad (1)$$

Similarly, assume that the surface area of the second parallel wiring portion 113, the first orthogonal wiring portion 112, and the second orthogonal wiring portion 114 corresponding to the second resistor 30 is S3 and the surface area of the third parallel wiring portion 115, the second orthogonal wiring portion 114, and the third orthogonal wiring portion 116 corresponding to the third resistor 40 is S4.

Figure 7:
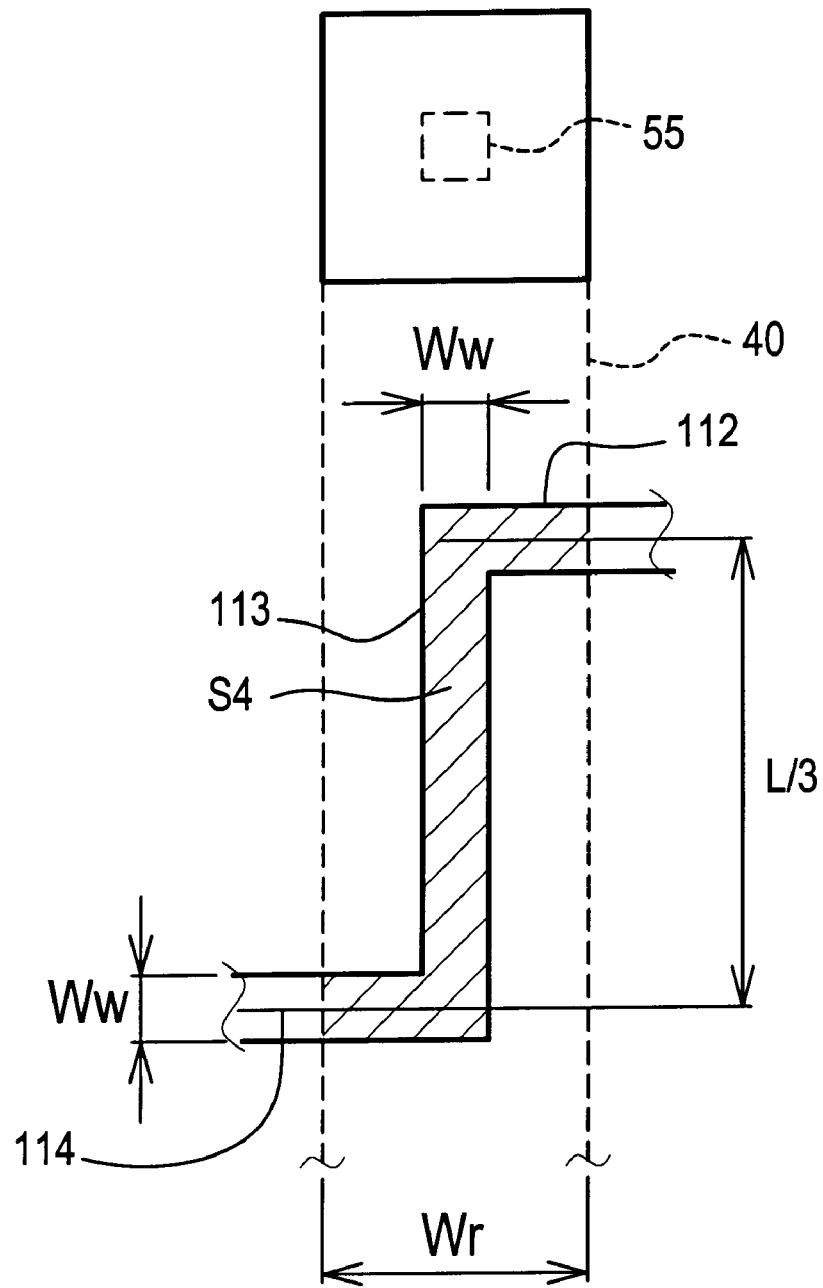
FIG. 7 is a partial illustrative view, showing the surface areas of the second wiring layer of FIG. 5 that correspond to the second and third resistors.

The surface areas S3 and S4 are equal, and are derived as follows, with reference to FIG. 7:

$$S3=S4=Ww(L/3+Wr) \quad (2)$$

From Equations (1) and (2), it is clear that S1+S2=S3=S4=Ww(L/3+Wr). This means that the surface areas of the second wiring layer 110 corresponding to each of the first to third resistors 20 to 40 are equal, establishing the same conditions as those of the first embodiment.

Therefore, this second embodiment of the invention makes it possible to reduce the amount of variations in the resistances of the first to third resistors 20 to 40 caused by piezoelectric effects.

In this case, the centerlines of the parallel wiring portions 111, 113, 115, and 117 of this embodiment match the centerlines of the first to third resistors 20 to 40. There is therefore less danger of misalignment occurring between the parts of the parallel wiring portions 111, 113, 115, and 117 and the first to third resistors 20 to 40, even if the mask used for patterning the parallel wiring portions 111, 113, 115, and 117 is somewhat misaligned. As a result, the danger of variations in the resistances of the first to third resistors 20 to 40 caused by misalignment of the mask is reduced.

Third Embodiment

Figure 8:
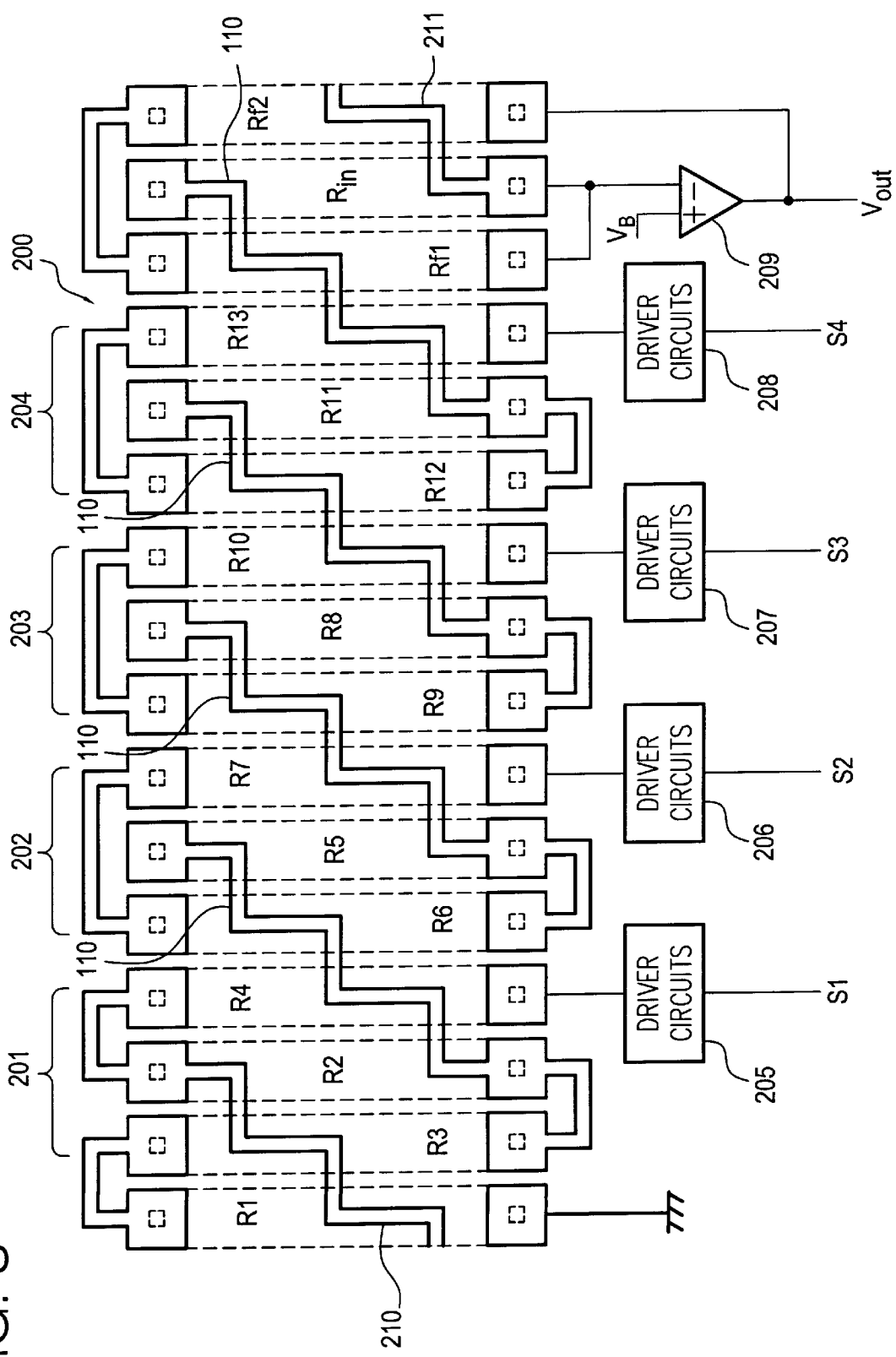
FIG. 8 is a schematic plan view of a D/A converter in accordance with a third embodiment of this invention.
Figure 9:
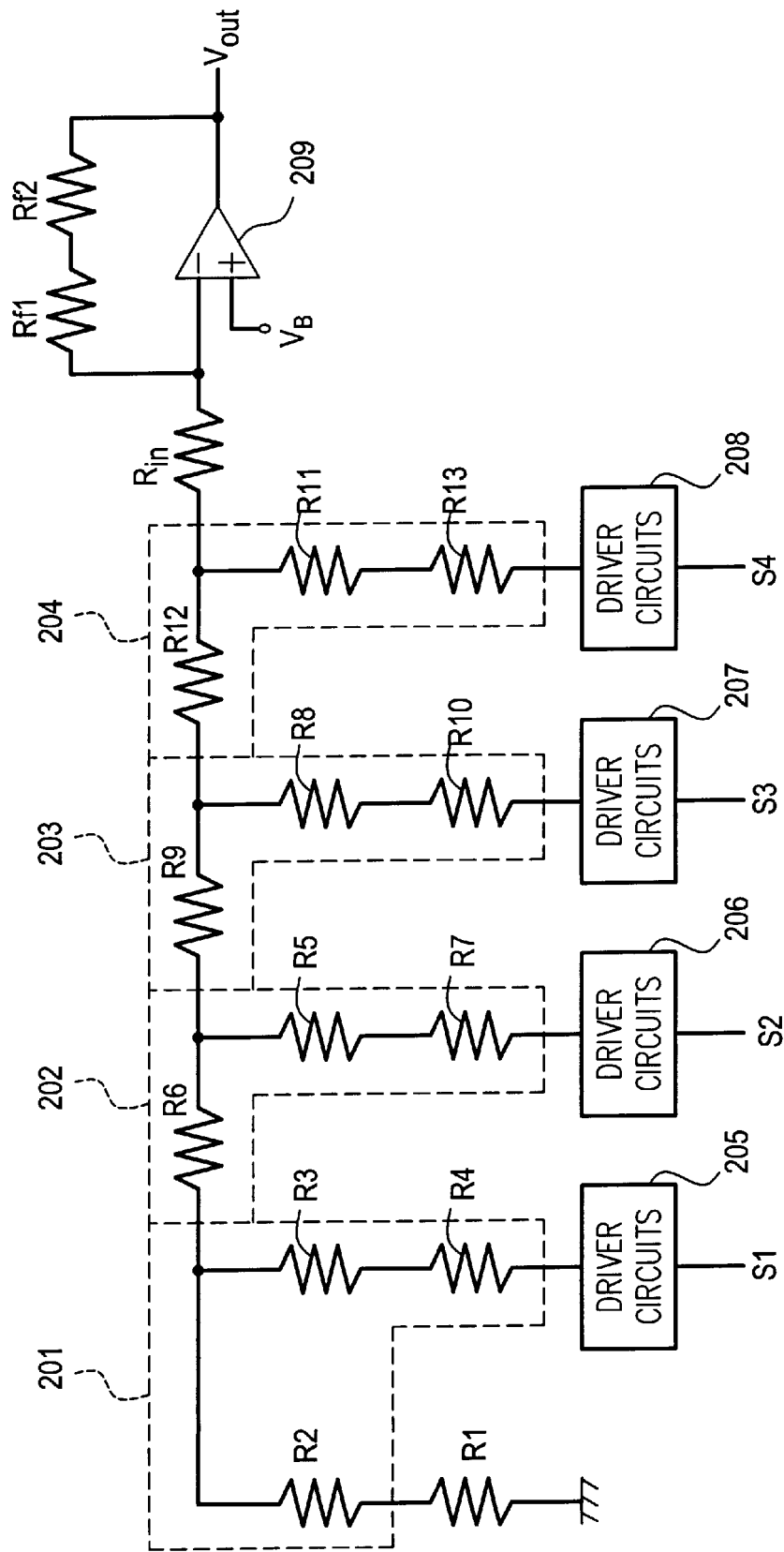
FIG. 9 is an equivalent circuit of the D/A converter of FIG. 8.

A 4-bit D/A converter 200 configured by using the resistance ladder 100 of FIG. 5 is shown in FIG. 8 and an equivalent circuit thereof is shown in FIG. 9. In FIG. 8, this D/A converter 200 has fist to fourth resistance groups 201 to 204. The first resistance group 201 has a first resistor R2, a second resistor R3, and a third resistor R4, where the second resistor R3 is connected to ground through a resistor R1. A driver circuit 205 that receives a first-bit digital signal S1 is connected to the third resistor R4.

The second resistance group 202 has a first resistor R5, a second resistor R6, and a third resistor R7, and a driver circuit 206 that receives a second-bit digital signal S2 is connected to the third resistor R7.

The third resistance group 203 has a first resistor R8, a second resistor R9, and a third resistor R10, and a driver circuit 207 that receives a third-bit digital signal S3 is connected to the third resistor R10.

The fourth resistance group 204 has a first resistor R11, a second resistor R12, and a third resistor R13, and a driver circuit 208 that receives a fourth-bit digital signal S4 is connected to the third resistor R13.

Each of the digital signals S1 to S4 that are input to the driver circuits 205 to 208 is either 0 or 1. In this case, each of the driver circuits 205 to 208 outputs 0 V when the corresponding digital signal S1 to S4 is low (0) or the power voltage $V_{DD}$ when it is high (1).

A differential amplifier 209 that outputs an output $V_{out}$ has an input resistance $R_{IN}$ connected to the negative input terminal thereof and a bias voltage $V_s$ (0 V) is input to the positive input terminal thereof. Feedback resistors (Rf1+Rf2) are connected between the negative input terminal and the output terminal of the differential amplifier 209.

In the resistance ladder of FIG. 8, the first to fourth resistance groups 201, 202, 203, and 204 are connected together by three parts of the second wiring layer 110, in a similar manner to that shown in FIG. 5. In addition, the fourth resistance group 204 is connected by the second wiring layer 110 to an input resistor $R_{IN}$.

In this embodiment of the invention, first and second dummy wiring layers 210 and 211 are also provided. The first dummy wiring layer 210 is formed on top of the resistors R1 to R3 as the same layer as the second wiring layer 110, and is formed to the same pattern as part of the second wiring layer 110. The second dummy wiring layer 211 is formed on top of the resistors $R_{IN}$ and Rf2 as the same layer as the second wiring layer 110, and is formed to the same pattern as part of the second wiring layer 110.

If the resistance of each of the resistors R1 to R13 is r0, the resistance of the input resistance $R_{IN}$ is rin, and the total resistance of the feedback resistors (Rf1+Rf2) is rf, the output voltage $V_{out}$ is given by:

$$V_{out} = \left\{\frac{-rf}{(r0+rin)}\right\} \times V_{dd} \times \left\{\frac{2^3 \times S4 + 2^2 \times S3 + 2^1 \times S2 + 2^0 \times S1}{2^4}\right\} \quad (3)$$

$$V_{out}(\text{fullscale}) = \left\{\frac{-rf}{(r0+rin)}\right\} \times V_{dd} \times \left\{\frac{2^4-1}{2^4}\right\} \quad (4)$$

In this case, if ref=2×r0 and rin=r0:

$$\frac{-rf}{(r0+rin)} = -\frac{2 \times r0}{r0+r0} = -1$$

Therefore:

$$V_{out} = -V_{dd} \times \left\{\frac{2^3 \times S4 + 2^2 \times S3 + 2^1 \times S2 + 2^0 \times S1}{2^4}\right\} \quad (5)$$

If the bias voltage $V_B$ is assumed to be $V_{dd}/2$, the output voltage $V_{out}$ is as follows:

$$V_{out} = \frac{V_{dd}}{2} \times \left\{1 + \frac{rf}{(r0+rin)}\right\} \times \left\{\frac{-rf}{(r0+rin)}\right\} \times V_{dd} \times \left\{\frac{2^3 \times S4 + 2^2 \times S3 + 2^1 \times S2 + 2^0 \times S1}{2^4}\right\} \quad (6)$$

$$V_{out}(\text{fullscale}) = \left\{\frac{-rf}{(r0+rin)}\right\} \times V_{dd} \times \left\{\frac{2^4-1}{2^4}\right\} \quad (7)$$

In this case, if rf=2×r0 and rin=r0:

$$\frac{-rf}{(r0+rin)} = -\frac{2 \times r0}{r0+r0} = -1$$

Therefore:

$$V_{out} = \frac{V_{dd}}{2} \times 2 - V_{dd} \times \left\{\frac{2^3 \times S4 + 2^2 \times S3 + 2^1 \times S2 + 2^0 \times S1}{2^4}\right\} \quad (8)$$

Since −rf/(r0+rin) is the full-scale value for the output voltage $V_{out}$ in this case, Equations (3) and (6) show that it is necessary to ensure that the resistance ratios of the resistance rf, r0, and rin are highly acccurate. This embodiment of the invention ensures that variations in the resistances of the resistors R1 to R13, $R_{IN}$, Rf1, and Rf2 are all equal, due to the presence of the four parts of the second wiring layer 110 and the first and second dummy wiring layers 210 and 211. Therefore, if the full-scale value of the output voltage $V_{out}$ is assumed to be such that −rf/(r0+rin)=−1, errors in the full-scale voltage can be reduced. Thus the conversion accuracy of the D/A converter 200 can be improved.

Figure 10:
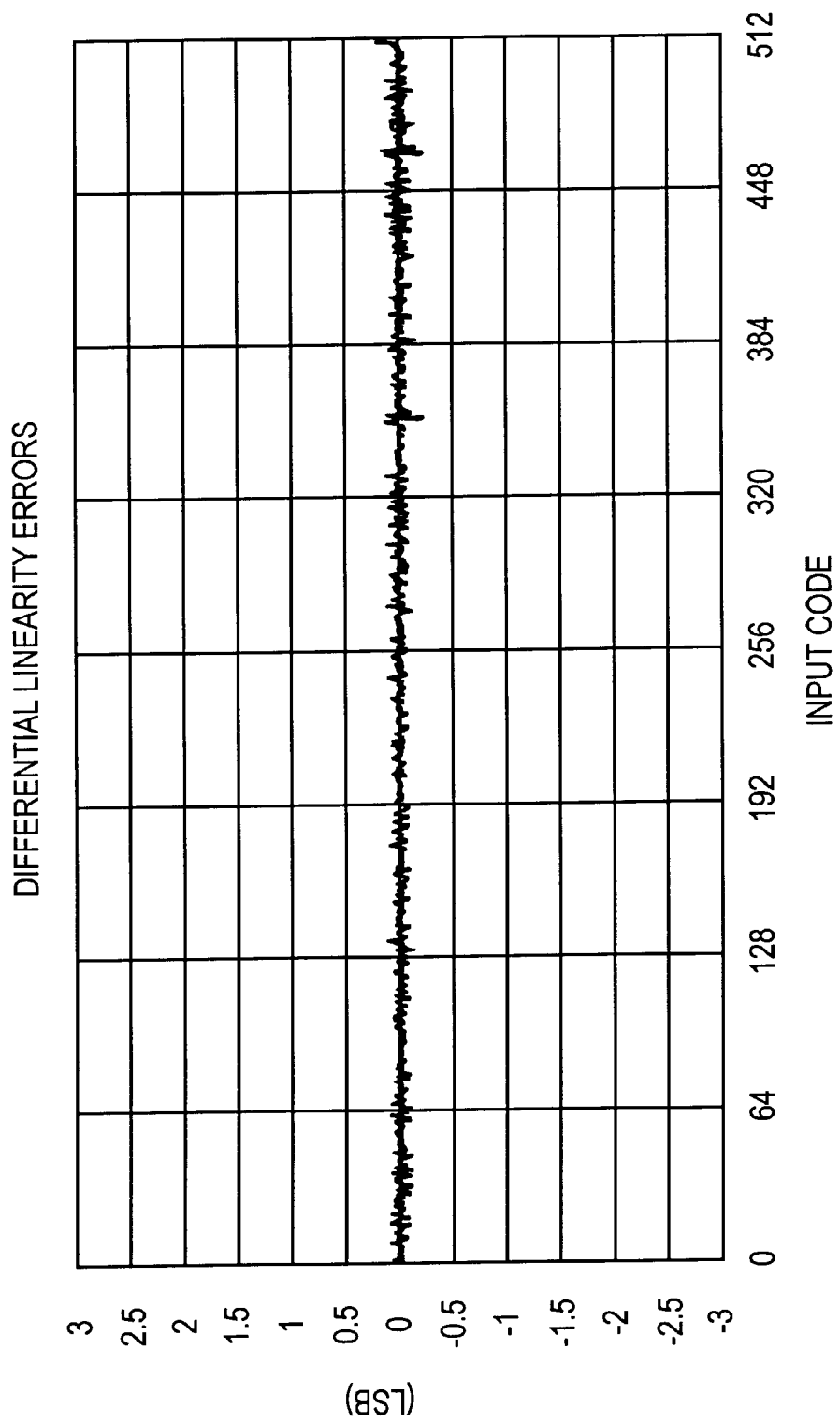
FIG. 10 is a graph of differential linearity errors in the D/A converter of FIG. 8.
Figure 11:
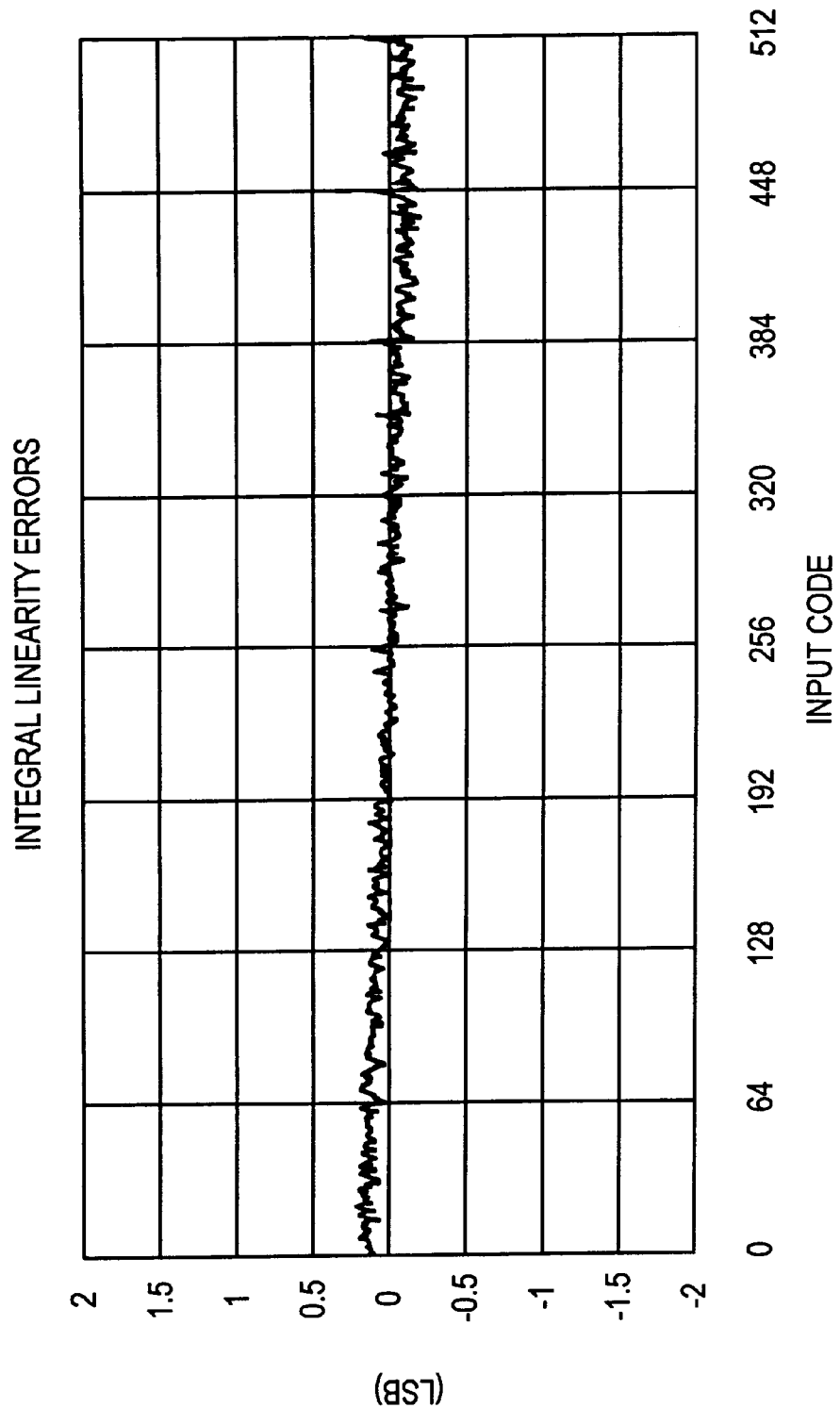
FIG. 11 is a graph of integral linearity errors in the D/A converter of FIG. 8.
Figure 19:
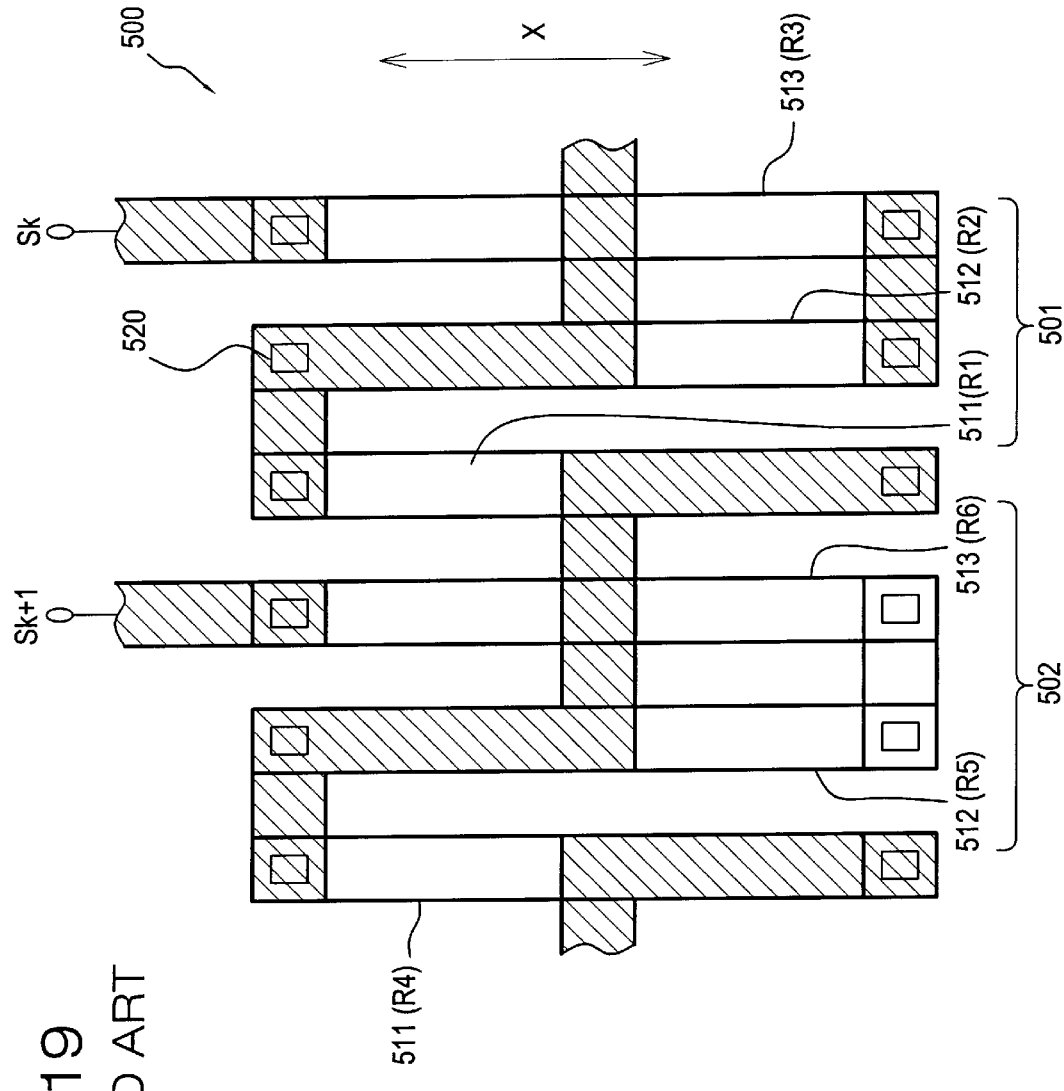
FIG. 19 is a plan view of a prior-art resistance ladder.
Figure 20:
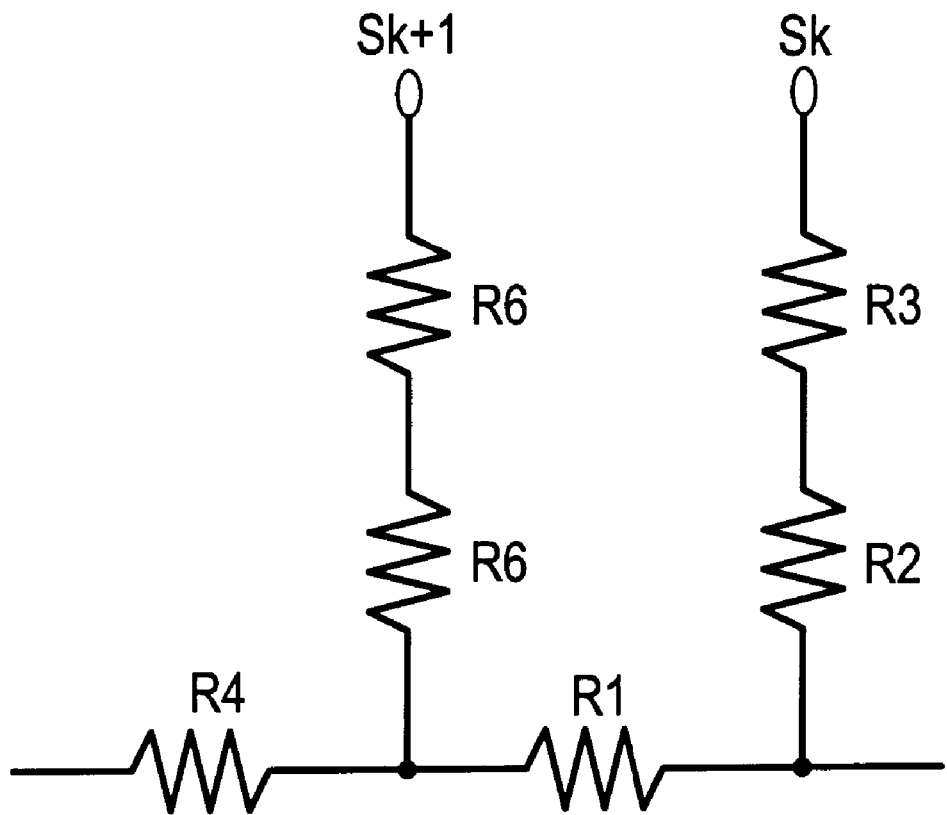
FIG. 20 is an equivalent circuit of the resistance ladder of FIG. 19.
Figure 21:
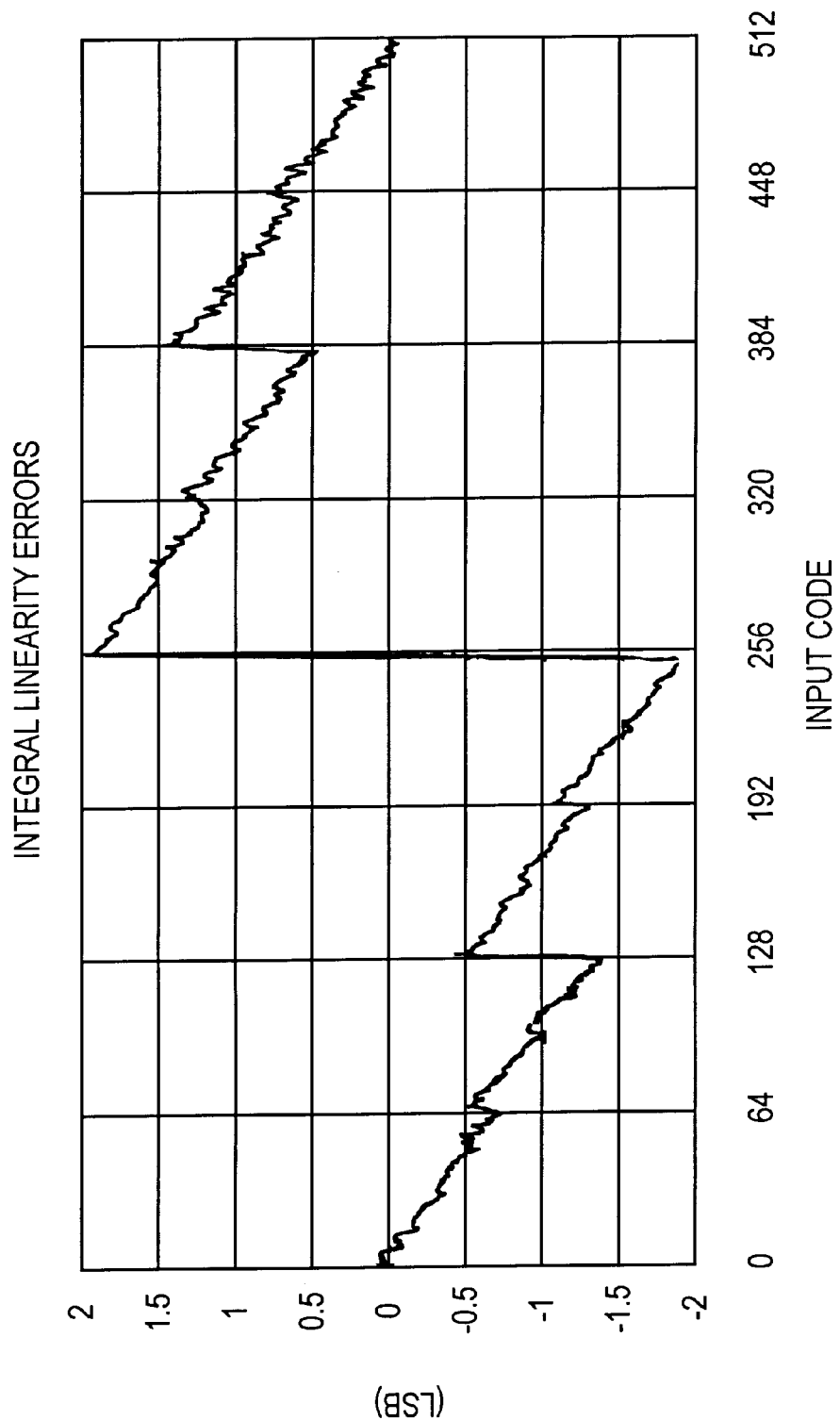
FIG. 21 is a graph of integral linearity errors in a D/A converter configured by using the resistance ladder of FIG. 19.
Figure 22:
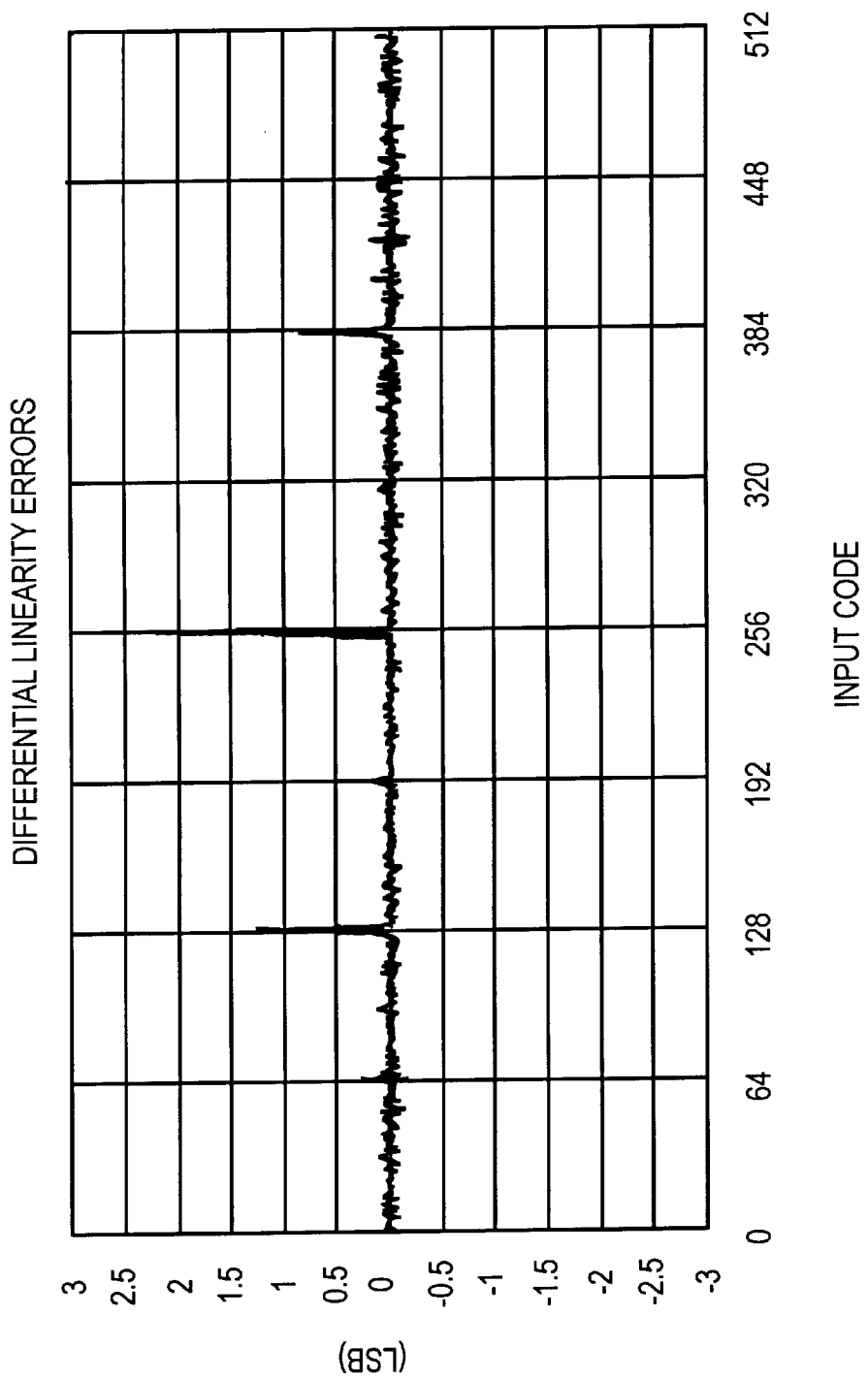
FIG. 22 is a graph of differential linearity errors in a D/A converter configured by using the resistance ladder of FIG. 19.

Differential linearity errors in the LSB obtained by using the D/A converter 200 of this embodiment are shown in FIG. 10 and integral linearity errors in the LSB are shown in FIG. 11. The equivalent characteristics for a D/A converter configured by using the prior-art resistance ladder of FIG. 19 are shown in FIGS. 21 and 22. It is clear from comparisons of FIGS. 10 and 21 and of FIGS. 11 and 22 that the D/A converter 200 of this embodiment has improved characteristics over those of the prior art.

Fourth Embodiment

Figure 12:
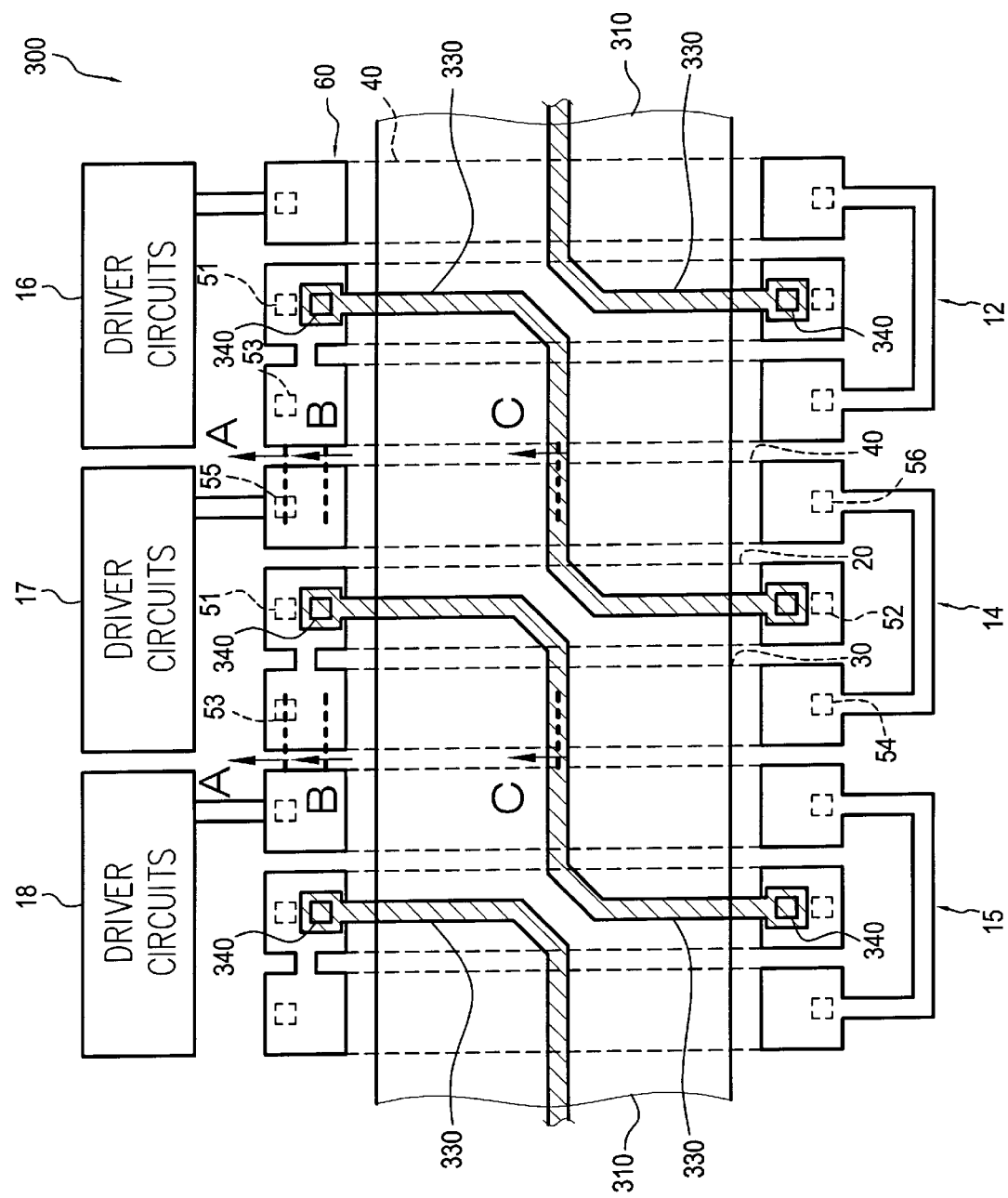
FIG. 12 is a schematic plan view of a resistance ladder in accordance with a fourth embodiment of this invention.
Figure 13:
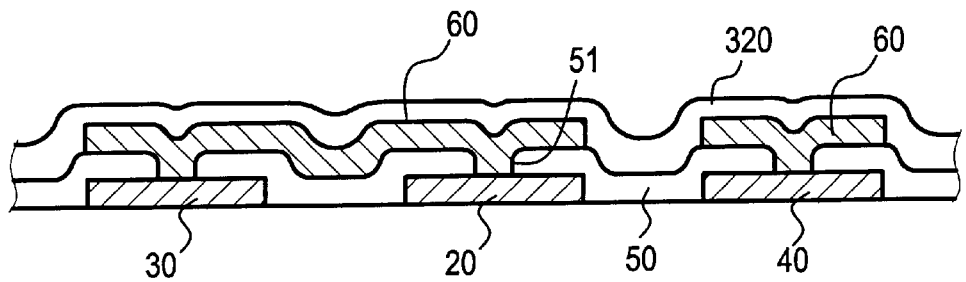
FIG. 13 is a cross-sectional view taken along the line A—A in FIG. 12.
Figure 14:
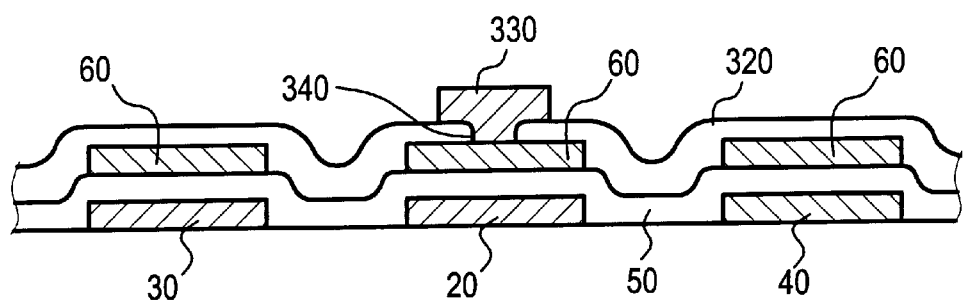
FIG. 14 is a cross-sectional view taken along the line B—B in FIG. 12.
Figure 15:
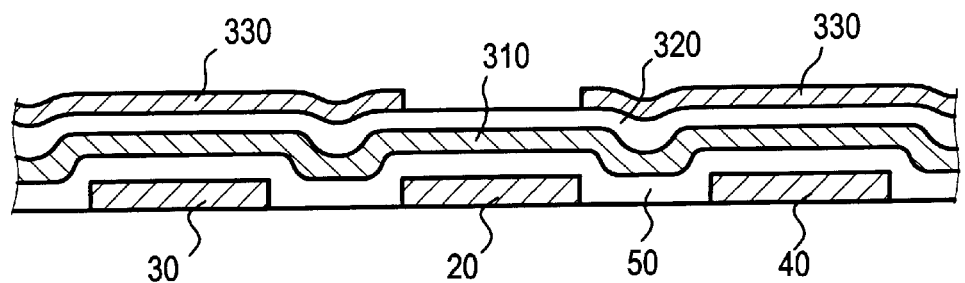
FIG. 15 is a cross-sectional view taken along the line C—C in FIG. 12.

A plan view of a resistance ladder 300 in accordance with a fourth embodiment of this invention is shown in FIG. 12. Cross-sectional views taken along the lines A—A, B—B, and C—C in FIG. 12 are shown in FIGS. 13 to 15, respectively. Note that components in FIGS. 12 to 15 that have the same function as components in FIGS. 1 and 5 are denoted by the same reference numbers and further description thereof is omitted. Note that, in this embodiment, the insulation layer 50 of FIGS. 1 and 5 is called a first insulation layer and the contact holes 51 to 56 are called first contact holes.

As shown in FIGS. 12 to 15, the resistance ladder 300 is not provided with the second wiring layer 70 or 110 that is formed as the same layer as the first wiring layer 60, but a second wiring layer 330 is formed at a different level instead. In other words, the first insulation layer 50 is formed on top of the first to third resistors 20 to 40, then the first wiring layer 60 and a dummy wiring layer 310 are formed on top of the first insulation layer 50, as indicated by solid lines in FIG. 12. A second insulation layer 320 is provided on top of the first wiring layer 60 and the dummy wiring layer 310, and the second wiring layer 330 is provided on top of this second insulation layer 320. The second wiring layer 330 is indicated by hatching in FIG. 12. The second wiring layer 330 is in contact with the first wiring layer 60 trough second contact holes 340 formed in the second insulation layer 320.

Assume that the surface areas of the dummy wiring layer 310 corresponding to each of the first to third resistors 20 to 40 are S1, S2, and S3, respectively. Similarly, assume that the surface areas of the second wiring layer 330 corresponding to the first to third resistors 20 to 40 are S4, S5, and S6.

In this case, S1=S2=S3 and also S1>S4, S2>S5, and S3>S6. With such conditions set, variations in the resistances of the first to third resistors 20 to 40 caused by piezoelectric effects subjectively depends on the surface areas S1 to S3. Since the surface areas S4, S5, and S6 have therefore substantially no effect, even although they are not the same. Variations in resistances of the resistors 20 to 40 are substantially the same because S1=S2=S3.

Fifth Embodiment

This fifth embodiment relates to an A/D converter configured by using a D/A converter in accordance with this invention. An A/D converter configured by using a D/A converter is known in the art, such as the successive-approximation A/D converter 400 shown in FIG. 16, by way of example. This A/D converter 400 has a sampling circuit 401 for sampling an analog signal, a D/A converter 402, a comparator 403 for comparing outputs from the sampling circuit 401 and the D/A converter 402, a sequencer 405 for outputting various timing signals based on a clock signal from an oscillator 404, and a successive-approximation register 406 for controlling the D/A converter 402, based on an output from the comparator 403 in accordance with timing signals from the sequencer 405.

Figure 16:
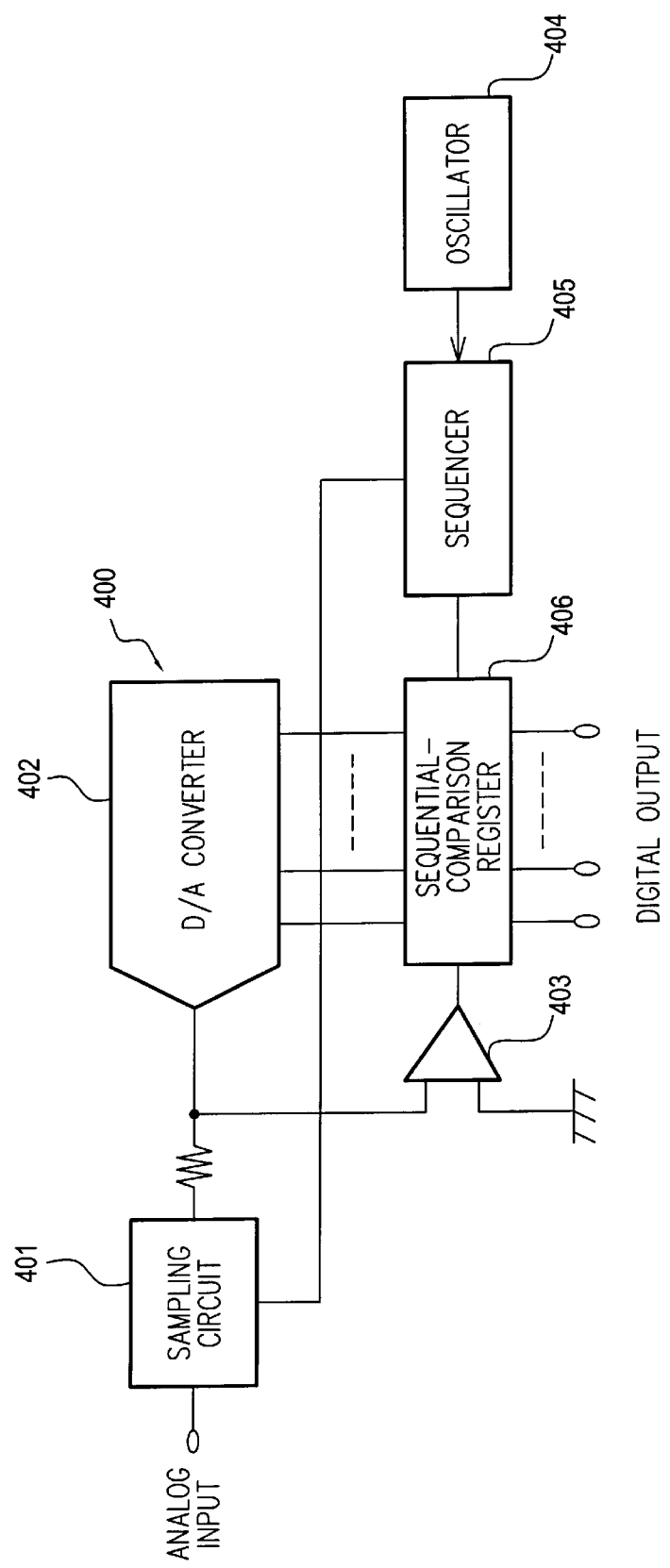
FIG. 16 is a block diagram of an A/D converter in accordance with a fifth embodiment of this invention.

Use of the D/A converter of this invention as the D/A converter 402 of FIG. 16 makes it possible to implement highly accurate analog-to-digital conversion.

What is claimed is:

1. A resistance ladder formed by connecting together a plurality of resistance groups, where each of said resistance groups has at least first to third resistors extending along a longitudinal axial direction, said resistance ladder comprising:

an insulation layer formed on top of each of said first to third resistors of each of said resistance groups and having contact holes at positions corresponding to end portions in said longitudinal axial direction of each of said first to third resistors;

a first wiring layer formed on top of said insulation layer, connecting together said first and second resistors and said second and third resistors within each of said resistance groups via said contact holes; and a second wiring layer formed as the same layer as said first wiring layer and connecting together adjacent resistance groups;

wherein said second and third resistors in each of said resistance groups are disposed parallel to said longitudinal axial direction and on either side of said first resistor;

wherein said second wiring layer connects together one end in said longitudinal axial direction of said first resistor of one of said adjacent resistance groups to the other end in said longitudinal axial direction of said first resistor of another of said adjacent resistance groups, and is also formed to extend over other resistors positioned between said first resistors of said adjacent resistance groups; and wherein surface areas of said second wiring layer corresponding to each of said first to third resistors in each of said resistance groups are set to be substantially equal.

2. The resistance ladder as defined in claim 1, wherein said second wiring layer is formed to extend linearly at a constant angle of inclination with respect to said longitudinal axial direction.

3. The resistance ladder as defined in claim 1, wherein said second wiring layer comprises a plurality of parallel wiring portions that are parallel to said longitudinal axial direction and a plurality of orthogonal wring portions that are perpendicular to said longitudinal axial direction, connecting said parallel wiring portions; and wherein, if the total length of said second wiring layer in said longitudinal axial direction is L, the length of each parallel wiring portion corresponding to said first to third resistors is set to be substantially L/3.

4. The resistance ladder as defined in claim 3, wherein the sum of the length of each parallel wiring portion connected to one end in said longitudinal axial direction of said first resistor in each of said resistance groups plus the length of the parallel wiring portion connected to the other end in said longitudinal axial of said first resistor is set to be substantially L/3.

5. The resistance ladder as defined in claim 1, wherein said resistance group positioned at a far end portion has a dummy wiring layer formed as the same layer as said second wiring layer.

6. A semiconductor device in which is incorporated the resistance ladder defined in claim 1, wherein said first to third resistors, said first and second wiring layers, and said insulation layer of said resistance ladder are formed in accordance with semiconductor fabrication processes.

7. A resistance ladder formed by connecting together a plurality of resistance groups, where each of said resistance groups has at least first to third resistors extending along a longitudinal axial direction, said resistance ladder comprising:

a first insulation layer formed on top of each of said first to third resistors and having first contact holes at positions corresponding to end portion in said longitudinal axial direction of each of said first to third resistors;

a first wiring layer formed on top of said first insulation layer, connecting together said first to third resistors via said contact holes;

a dummy wiring layer formed as the same layer as said first wiring layer and corresponding to said first to third resistors;

a second insulation layer formed on top of said first wiring layer and said dummy wiring layer and having second contact holes at positions corresponding to said first wiring layer; and a second wiring layer formed on top of said second insulation layer and connecting together adjacent resistance groups via second said contact holes.

8. The resistance ladder as defined in claim 7, wherein surface areas of said second wiring layer corresponding to each of said first to third resistors are not the same.

9. The resistance ladder as defined in claim 7, wherein said second and third resistors within each of said resistance groups are disposed parallel to said longitudinal axial direction and on either side of said first resistor; and wherein said first wiring layer connects together said first and second resistors and said second and third resistors within each of said resistance groups.

10. A semiconductor device in which is incorporated the resistance ladder as defined in claim 7, wherein said first to third resistors, said first and second wiring layers, said dummy wiring layer, and said first and second insulation layers of said resistance ladder are formed in accordance with semiconductor fabrication processes.

11. A digital-to-analog converter for converting an n-bit digital signal into an analog signal, said digital-to-analog converter comprising:

a resistance ladder formed by connecting together n resistance groups, where each of said resistance groups has at least first to third resistors extending along a longitudinal axial direction; and n driver circuits connected each to one of said resistance groups and also disposed in a line on the same side of said resistance groups;

wherein said resistance ladder comprises:

an insulation layer formed on top of each of said first to third resistors of each of said resistance groups and having contact holes at positions corresponding to end portions in said longitudinal axial direction of each of said first to third resistors;

a first wiring layer formed on top of said insulation layer, connecting together said first and second resistors and said second and third resistors within each of said resistance groups via said contact holes; and a second wiring layer formed as the same layer as said first wiring layer and connecting together adjacent resistance groups;

wherein said second and third resistors in each of said resistance groups are disposed parallel to said longitudinal axial direction and on either side of said first resistor;

wherein said second wiring layer connects together one end in said longitudinal axial direction of said first resistor of one of said adjacent resistance groups to the other end in said longitudinal axial direction of said first resistor of another of said adjacent resistance groups, and is also formed to extend over other resistors positioned between said first resistors of said adjacent resistance groups; and wherein surface areas of said second wiring layer corresponding to each of said first to third resistors in each of said resistance groups are set to be substantially equal.

12. The digital-to-analog converter as defined in claim 11, further comprising:

a differential amplifier which outputs an analog output from an output terminal thereof;

an (n+1)th resistance group disposed adjacent to the nth resistance group that is positioned at a far end portion of said n resistance groups, and connected to said differential amplifier; and a third wiring layer formed as the same layer as said second wiring layer and connecting together said nth resistance group and said (n+1)th resistance group;

wherein said (n+1)th resistance group comprises:

an input resistor connected to an input terminal of said differential amplifier; and first and second feedback resistors connected between said input terminal and said output terminal of said differential amplifier;

wherein said first and second feedback resistors within said (n+1)th resistance group are disposed parallel to said longitudinal axial direction, on either side of said input resistor; and wherein said third wiring layer connects together one end in said longitudinal axial direction of said input resistor of said (n+1)th resistance group to the other end in said longitudinal axial direction of said first resistor of said nth resistance group, and is also formed as the same pattern as said second wiring layer, passing over said third resistor of said nth resistance group and said first feedback resistor of said (n+1)th resistance group.

13. The digital-to-analog converter as defined in claim 12, wherein a dummy wiring layer is further provided over said input resistor and said second feedback resistor.

14. A semiconductor device in which is incorporated the digital-to-analog converter as defined in claim 11, wherein said resistance ladder and said driver circuits of said digital-to-analog converter are formed in accordance with semiconductor fabrication processes.

15. A semiconductor device in which is incorporated an analog-to-digital converter comprising the digital-to-analog converter as defined in claim 11, wherein said analog-to-digital converter is formed in accordance with semiconductor fabrication processes.

16. A digital-to-analog converter for converting an n-bit digital signal into an analog signal, said digital-to-analog converter comprising:

a resistance ladder formed by connecting together n resistance groups, where each of said resistance groups has at least first to third resistors extending along a longitudinal axial direction; and n driver circuits connected each to one of said resistance groups;

wherein said resistance ladder comprises:

a first insulation layer formed on top of each of said first to third resistors and having first contact holes at positions corresponding to end portion in said longitudinal axial direction of each of said first to third resistors;

a first wiring layer formed on top of said first insulation layer, connecting together said first to third resistors via said first contact holes;

a dummy wiring layer formed as the same layer as said first wiring layer and corresponding to said first to third resistors;

a second insulation layer formed on top of said dummy wiring layer and having second contact holes at positions corresponding to said first wiring layer; and a second wiring layer formed on top of said second insulation layer and connecting together adjacent resistance groups via said second contact holes.

17. The digital-to-analog converter as defined in claim 16, wherein surface areas of said second wiring layer corresponding to each of said first to third resistors are not the same.

18. The digital-to-analog converter as defined in claim 16, wherein said second and third resistors within each of said resistance groups are disposed parallel to said longitudinal axial direction and on either side of said first resistor;

wherein said first wiring layer connects together said first and second resistors and also said second and third resistors within each of said resistance groups; and wherein said n driver circuits are disposed at one side of said longitudinal axial direction.

19. A semiconductor device in which is incorporated the digital-to-analog converter as defined in claim 16, wherein said resistance ladder and said driver circuits of said digital-to-analog converter are formed in accordance with semiconductor fabrication processes.

20. A semiconductor device in which is incorporated an analog-to-digital converter comprising the digital-to-analog converter as defined in claim 16, wherein said analog-to-digital converter is formed in accordance with semiconductor fabrication processes.

21. A digital-to-analog converter for converting an n-bit digital signal into an analog signal, said digital-to-analog converter comprising:

a resistance ladder formed by connecting together n resistance groups, where each of said resistance groups has at least first to third resistors extending along a longitudinal axial direction; and n driver circuits connected each to one of said resistance groups;

wherein said resistance ladder comprises:

a first insulation layer formed on top of each of said first to third resistors of each of said resistance groups and having contact holes corresponding to end portions in said longitudinal axial direction of each of said first to third resistors;

a first wiring layer formed on top of said first insulation layer, connecting together said first and second resistors and said second and third resistors within each of said resistance groups via said contact holes; and a second wiring layer formed as the same layer as said first wiring layer and connecting together adjacent resistance groups;

wherein said second and third resistors in each of said resistance groups are disposed parallel to said longitudinal axial direction and on either side of said first resistor;

wherein said second wiring layer connects together one end in said longitudinal axial direction of said first resistor of one of adjacent resistance groups to the other end in said longitudinal axial direction of said first resistor of another of said adjacent resistance groups, and is also formed to extend over other resistors positioned between said first resistors of said adjacent resistance groups; and wherein said n driver circuits are connected each to one of said third resistors of said resistance groups and are also disposed at one side in said longitudinal axial direction.

22. A semiconductor device in which is incorporated the digital-to-analog converter as defined in claim 21, wherein said resistance ladder and said driver circuits of said digital-to-analog converter are formed in accordance with semiconductor fabrication processes.

23. A semiconductor device in which is incorporated an analog-to-digital converter comprising the digital-to-analog converter as defined in claim 21, wherein said analog-to-digital converter is formed in accordance with semiconductor fabrication processes.

* * * * *

UNITED STATES PATENT AND TRADEMARK OFFICE
CERTIFICATE OF CORRECTION

PATENT NO. : 6,208,281 B1
DATED : March 27, 2001
INVENTOR(S) : Keiji Jinbo, Akihiro Fukuzawa It is certified that error appears in the above-identified patent and that said Letters Patent is hereby corrected as shown below:

Title page, Item [54], and Column 1, lines 1-3,
Title should read:

-- RESISTANCE LADDER TOGETHER WITH DIGITAL-ANALOG CONVERTER AND SEMICONDUCTOR DEVICE USING THE SAME --

Signed and Sealed this

Twenty-sixth Day of March, 2002

Attest:

*Attesting Officer*

JAMES E. ROGAN
*Director of the United States Patent and Trademark Office*